(12) United States Patent
Ueberreiter et al.

(10) Patent No.: US 9,535,319 B2
(45) Date of Patent: Jan. 3, 2017

(54) RETICLE, SYSTEM COMPRISING A PLURALITY OF RETICLES AND METHOD FOR THE FORMATION THEREOF

(71) Applicant: GLOBALFOUNDRIES Inc., Grand Cayman (KY)

(72) Inventors: Guido Ueberreiter, Dresden (DE); Guoxiang Ning, Ballston Lake, NY (US); Jui-Hsuan Feng, Ballston Lake, NY (US); Paul Ackmann, Gansevoort, NY (US); Chin Teong Lim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 119 days.

(21) Appl. No.: 14/674,157

(22) Filed: Mar. 31, 2015

(65) Prior Publication Data

US 2016/0291457 A1 Oct. 6, 2016

(51) Int. Cl.
*G03F 1/36* (2012.01)
*G03F 7/30* (2006.01)
*H01L 21/768* (2006.01)

(52) U.S. Cl.
CPC . *G03F 1/36* (2013.01); *G03F 7/30* (2013.01); *H01L 21/76805* (2013.01); *H01L 21/76814* (2013.01); *H01L 21/76816* (2013.01)

(58) Field of Classification Search
CPC ........ G03F 1/36; G03F 7/30; H01L 21/76805; H01L 21/76816; H01L 21/76814
USPC ........................................................ 430/5, 30
See application file for complete search history.

(56) References Cited

U.S. PATENT DOCUMENTS

| | | | | |
|---|---|---|---|---|
| 5,849,440 | A * | 12/1998 | Lucas | G03F 1/144 382/144 |
| 5,900,340 | A * | 5/1999 | Reich | G03F 1/144 430/22 |
| 6,472,108 | B1 * | 10/2002 | Lin | G03F 1/144 430/30 |
| 6,709,793 | B1 * | 3/2004 | Brankner | G03F 1/144 430/30 |
| 8,161,421 | B2 * | 4/2012 | Viswanathan | G03F 1/14 716/53 |

* cited by examiner

*Primary Examiner* — Christopher Young
(74) *Attorney, Agent, or Firm* — Amerson Law Firm, PLLC

(57) ABSTRACT

A method includes providing a pre-optical proximity correction (OPC) layout of at least a portion of at least one reticle. The pre-OPC layout defines a test cell including a first test cell area having a plurality of first target features having a first pitch and a second test cell area having a plurality of second target features having a second pitch. A post-OPC layout of the portion of the reticle is formed on the basis of the pre-OPC layout. The formation of the post-OPC layout includes performing a rule-based OPC process, wherein a plurality of first reticle features for the first test cell area are provided on the basis of the plurality of first target features, and performing a model-based OPC process, wherein a plurality of second reticle features for the second test cell area are provided on the basis of the plurality of second target features.

28 Claims, 14 Drawing Sheets

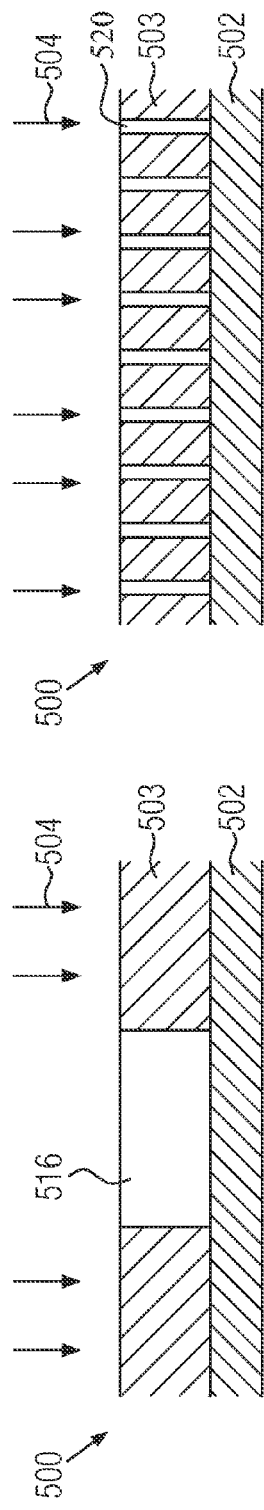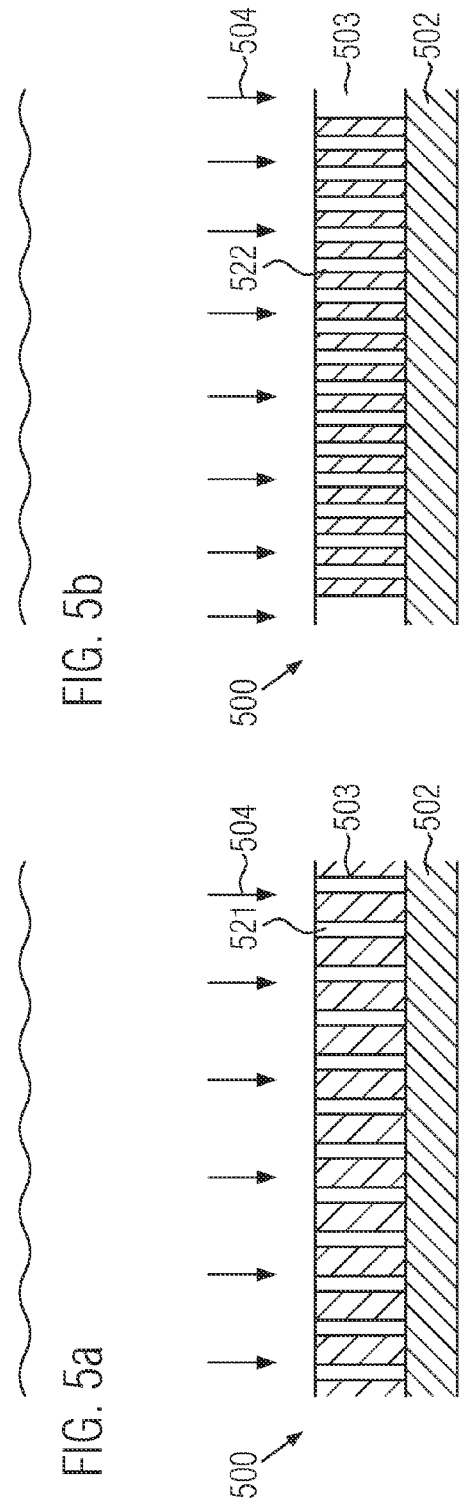

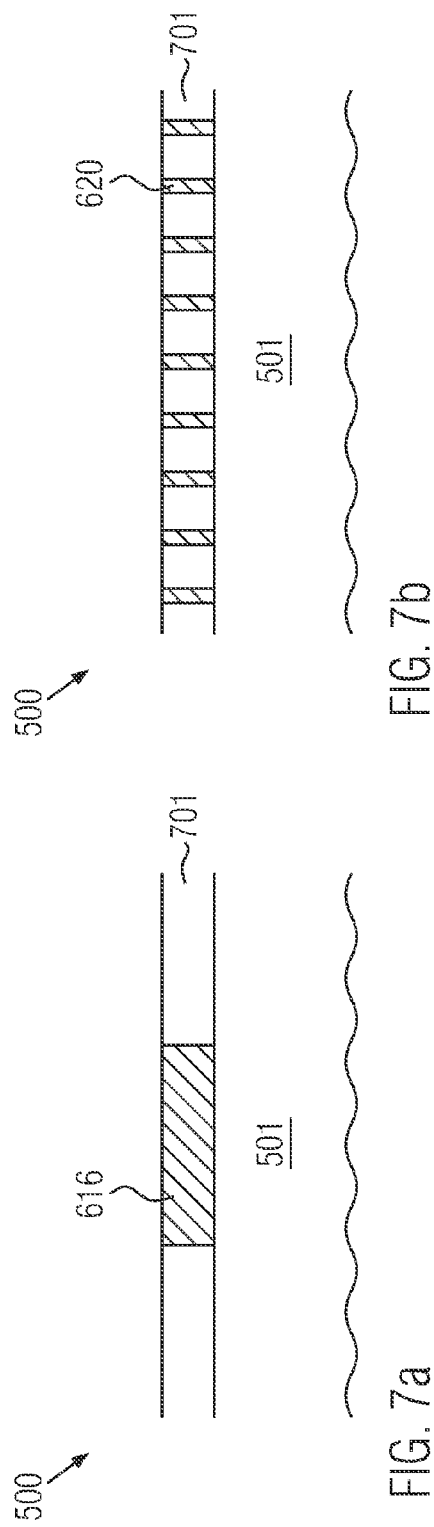
FIG. 7a
FIG. 7b
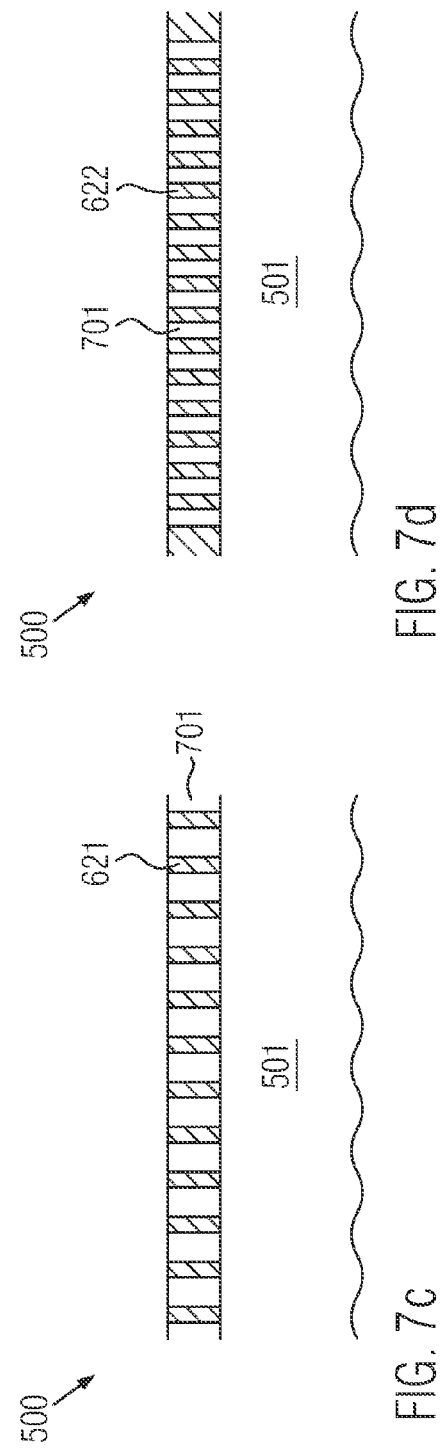
FIG. 7c
FIG. 7d

RETICLE, SYSTEM COMPRISING A PLURALITY OF RETICLES AND METHOD FOR THE FORMATION THEREOF

BACKGROUND OF THE INVENTION

1. Field of the Invention

Generally, the present disclosure relates to the manufacturing of integrated circuits, and, more particularly, to the creation of reticles for use in photolithography processes that include one or more test cells.

2. Description of the Related Art

Integrated circuits typically include a large number of circuit elements which include, in particular, field effect transistors. Other types of circuit elements which may be present in integrated circuits include capacitors, diodes and resistors. The circuit elements in an integrated circuit may be electrically connected by means of electrically conductive metal lines formed in a dielectric material, for example, by means of damascene techniques. The electrically conductive metal lines may be provided in a plurality of interconnect layers that are stacked on top of each other above a substrate in and on which the circuit elements are formed. Metal lines in different interconnect layers may be electrically connected with each other by means of contact vias that are filled with metal.

For the formation of integrated circuits, techniques of photolithography may be used. In a photolithography process, a reticle (sometimes also denoted as "photomask") is projected to a layer of a photoresist that is provided over a wafer. The wafer may include one or more integrated circuits in a stage of a manufacturing process. Portions of the photoresist are irradiated with electromagnetic radiation that is used for projecting the reticle to the photoresist. Other portions of the photoresist are not irradiated, wherein the pattern of irradiated and non-irradiated portions of the photoresist depends on a pattern of reticle features provided on the reticle.

Thereafter, the photoresist can be developed. Depending on whether a negative or a positive photoresist is used, in the development process, either the non-irradiated portions or the irradiated portions of the photoresist are dissolved in a developer and, thus, are removed from the semiconductor structure.

Thereafter, processes for patterning the semiconductor structure can be performed using the portions of the photoresist remaining on the wafer as a photoresist mask. The processes for patterning the semiconductor structure may include one or more etch processes. Thus, features can be formed on the wafer.

In the formation of small features by means of photolithography processes, optical proximity correction (OPC) techniques may be used. In OPC techniques, shapes of reticle features that are provided on the reticle may be modified compared to shapes of target features that are to be formed in the photoresist mask on the wafer in order to compensate for image errors in the projection of the reticle to the photoresist on the wafer and/or other process errors.

Furthermore, resolution enhancement techniques may be used, wherein assist features, which are sometimes also denoted as "sub resolution assist features" (SRAFs), are provided on the reticle in addition to printing reticle features which are employed for forming photoresist features of the photoresist mask. Assist features may be small reticle features which may, for example, have a bar shape and which are provided on the reticle in the vicinity of the printing reticle features. When the reticle is used in a photolithography process, typically no photoresist features corresponding to the assist features are formed in the photoresist mask. However, the presence of assist features may reduce a sensitivity of the photolithography process with respect to variations of parameters of the photolithography process, which may include, in particular, a focus of the projection and a dose of the radiation used for projecting the reticle to the photoresist.

Techniques for performing OPC include rule-based OPC processes and model-based OPC processes. In rule-based OPC processes, edges of reticle features may be moved relative to edges of target features and/or additional polygons may be added to the reticle features. The movement of edges and/or the addition of polygons may be performed on the basis of a set of rules that is defined by a rule script. The rules may include, for example, an addition of serifs at convex corners of reticle features, a removal of portions of reticle features at concave corners or a modification of a size of reticle features, for example, an increase of a size of reticle features that are provided for forming photoresist features employed in the formation of isolated contact vias.

In model-based OPC techniques, a simulation of a photolithography process, that may include a simulation of the formation of an aerial image by the optical system of the photolithography tool and/or a simulation of the behavior of the photoresist, may be performed, and a modification of the shapes of the reticle features compared to the shapes of the target features may be performed on the basis of results of the simulation so that a better agreement between the shapes of the photoresist features in the photomask with the shapes of the target features is obtained.

An inclusion of assist features may also be performed in accordance with rule-based techniques or model-based techniques.

For monitoring the performance of photolithography processes, measurements of critical dimension uniformity (CDU) may be performed, wherein dimensions of test features on a reticle and/or test features on a wafer that are formed using the reticle are measured for assessing a quality of the reticle and/or a quality of the manufacturing process that was employed for the formation of the test features on the wafer.

The test features may be provided in test cells, wherein one or more test cells may be provided on the reticle. The test cells may include arrangements of test features adapted for reticle CDU measurements, wherein critical dimensions of reticle features are measured on the reticle, and test features adapted for wafer CDU measurements that may be used for forming test structures on a wafer. Critical dimensions of the test structure on the wafer may then be measured. Furthermore, test features for measuring a reticle registration may be provided in the test cells.

Known techniques for providing test cells may have disadvantages associated therewith, which may include a relatively large amount of space required on the reticle and the wafer for the test cells, which may be aggravated by the placement of the test cells in frames. Furthermore, the formation of known test cells may have difficulties associated therewith, which may be caused by limitations of OPC and/or dose mapper (DOMA) compensation techniques in the formation of the reticles by means of electron beam lithography, in particular when techniques of the 28 nm technology node or below are used. Furthermore, known test cells do not allow a process monitoring of etch processes and an erosion monitoring of chemical mechanical polishing processes that are performed in semiconductor manufacturing processes.

The present disclosure provides reticles, systems including a plurality of reticles and methods that may help to overcome or at least reduce some or all of the abovementioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a pre-optical proximity correction (OPC) layout of at least a portion of at least one reticle. The pre-OPC layout includes a test cell including a first test cell area and a second test cell area. The first test cell area includes a plurality of first target features having a first pitch. The second test cell area includes a plurality of second target features having a second pitch. A post-OPC layout of the at least a portion of the at least one reticle is formed on the basis of the pre-OPC layout. The formation of the post-OPC layout includes performing a rule-based OPC process and performing a model-based OPC process. In the rule-based OPC process, a plurality of first reticle features for the first test cell area are provided on the basis of the plurality of first target features. In the model-based OPC process, a plurality of second reticle features for the second test cell area are provided on the basis of the plurality of second target features.

An illustrative reticle disclosed herein includes a die area. The die area includes a test cell. The test cell includes a first test cell area, a second test cell area and a third test cell area. The first test cell area includes a plurality of first reticle features adapted for patterning a photoresist in a photolithography process so that a plurality of first photoresist features having a first pitch are formed. The second test cell area includes a plurality of second reticle features adapted for patterning the photoresist in the photolithography process so that a plurality of second photoresist features having a second pitch are formed. The third test cell area includes a plurality of third reticle features adapted for patterning the photoresist in the photolithography process so that one or more third photoresist features forming a registration test pattern are formed. The second pitch is greater than the first pitch.

An illustrative system disclosed herein includes a plurality of reticles adapted for use in a multiple patterning photolithography process. Each of the plurality of reticles includes a die area. The die area includes a test cell. The test cell includes a first test cell area, a second test cell area and a third test cell area. The first test cell areas of the test cells of the plurality of reticles are adapted for patterning a photoresist in the multiple patterning photolithography process so that a plurality of first photoresist features having a first pitch are formed. The second test cell areas of the test cells of the plurality of reticles are adapted for patterning the photoresist in the multiple patterning photolithography process so that a plurality of second photoresist features having a second pitch are formed. The second pitch is greater than the first pitch. The third test cell areas of the test cells of the plurality of reticles are adapted for patterning the photoresist in the multiple patterning photolithography process so that one or more registration test patterns are formed.

BRIEF DESCRIPTION OF THE DRAWINGS

The disclosure may be understood by reference to the following description taken in conjunction with the accompanying drawings, in which like reference numerals identify like elements, and in which:

FIGS. 5a-7d show schematic cross-sectional views of portions of a wafer in stages of a method according to an embodiment;

Figure 1:
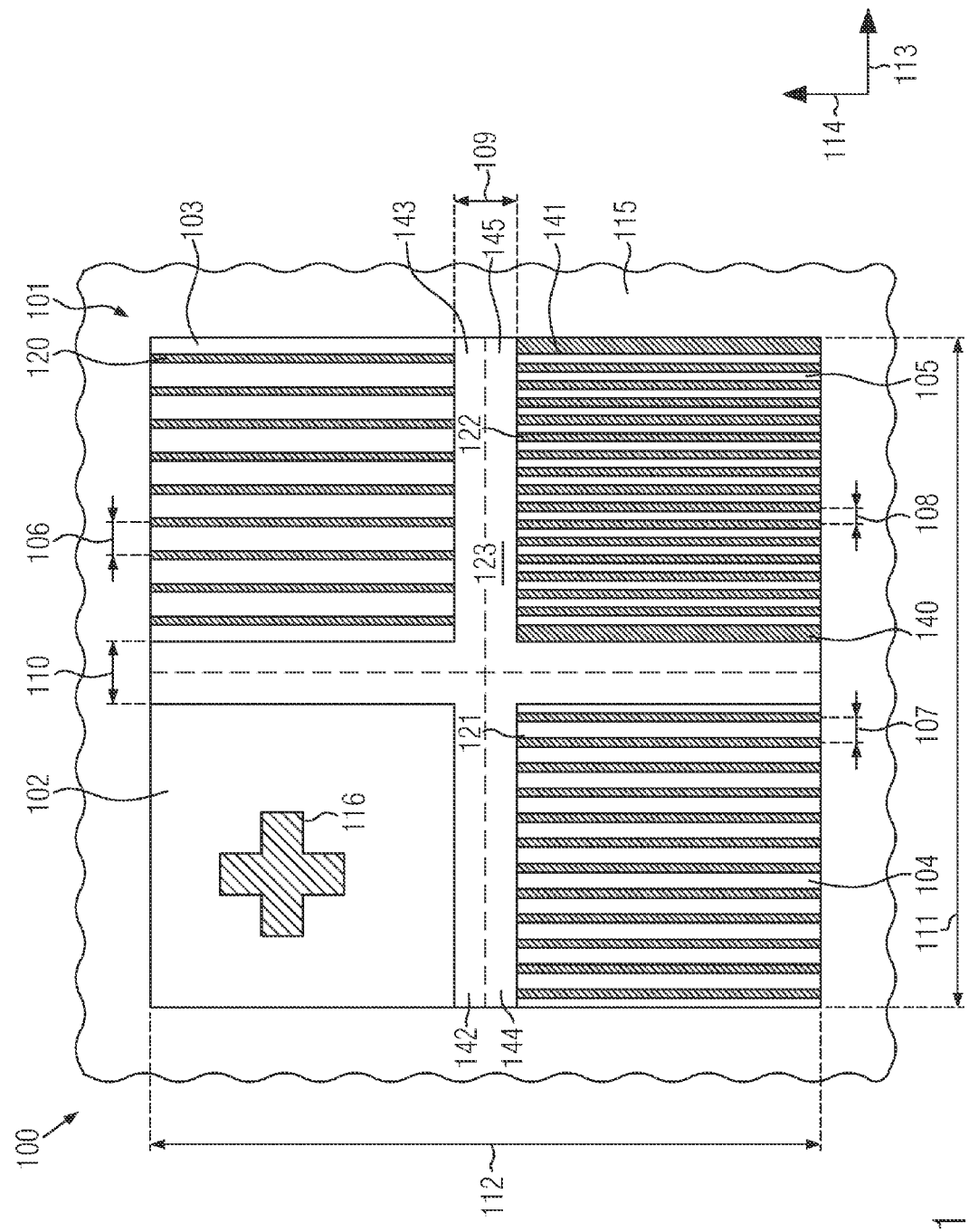
FIG. 1 shows a schematic view illustrating a pre-OPC layout of a portion of a reticle according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

FIG. 1 shows a schematic view illustrating a pre-optical proximity correction (pre-OPC) layout 100 of a portion of a reticle 115. The pre-OPC layout 100 includes a plurality of target features, wherein each of the target features defines a shape of a photoresist feature of a photoresist mask that is formed from a photoresist layer in a photolithography process, wherein the photoresist layer is exposed by projecting the reticle 115 to the photoresist layer by means of a photolithography tool. As will be detailed below, in later stages of a method disclosed herein, processes of optical proximity correction (OPC) may be performed for forming a post-optical proximity correction (post-OPC) layout 400 (see FIG. 4) on the basis of the pre-OPC layout 100.

In the OPC processes, reticle features may be provided on the basis of the target features of the pre-OPC layout 100. In the formation of the reticle 115, the reticle features may be formed on the reticle 115 using techniques such as, for example, electron beam lithography. The shapes of the reticle features may differ from the shapes of the target features of the pre-OPC layout 100 to a certain extent so that the photoresist features formed on the wafer have shapes that more closely resemble the shapes of the target features of the pre-OPC layout 100 than photoresist features that could be obtained by using reticle features having shapes that are identical to the shapes of the target features of the pre-OPC layout 100.

The pre-OPC layout 100 includes a test cell 101. The test cell 101 may include a test cell area 102, a test cell area 103, a test cell area 104 and a test cell area 105. The test cell 101 may have a generally rectangular shape, wherein each of the sides of the rectangle extends along one of a direction 113 (horizontal in the view of FIG. 1) and a direction 114 (vertical in the view of FIG. 1), wherein the directions 113, 114 are perpendicular to each other. In some embodiments, the test cell 101 may have an approximately square shape, wherein an extension 111 of the test cell 101 in the direction 113 is approximately equal to an extension 112 of the test cell 101 in the direction 114. In other embodiments, the extensions 111, 112 may be different.

Each of the test cell areas 102 to 105 may be provided in one of the quadrants of the test cell 101. In the view of FIG. 1, the test cell area 102 is provided in the upper left quadrant, the test cell area 103 is provided in the upper right quadrant, the test cell area 104 is provided in the lower left quadrant, and the test cell area 105 is provided in the lower right quadrant. Accordingly, the test cell areas 102, 103 are adjacent to each other along the direction 113, the test cell areas 104, 105 are adjacent to each other along the direction 113, the test cell areas 102, 104 are adjacent to each other along the direction 114, and the test cell areas 103, 105 are adjacent to each other along the direction 114.

The test cell 101 may include a gap area 123 that is provided between adjacent ones of the test cell areas 102-105. The gap area 123 may include a portion extending between the test cell area 102 and the test cell area 104 and between the test cell area 103 and the test cell area 105 that has an extension 109 along the direction 114. Additionally, the gap area 123 may include a portion extending between the test cell area 102 and the test cell area 103 and between the test cell area 104 and the test cell area 105 that has an extension 110 along the direction 113. The gap area 123 may be generally cross-shaped. The extensions 109, 110 of the gap area 123 may be approximately equal.

In some embodiments, the gap area 123 may be provided by a test cell bond area 142 of the test cell area 102, a test cell bond area 143 of the test cell area 103, a test cell bond area 144 of the test cell area 104 and a test cell bond area 145 of the test cell area 105. Each of the test cell bond areas 142, 143, 144, 145 may extend along two sides of a respective one of the test cell areas 102, 103, 104, 105. At the other two sides of the test cell areas 102, 103, 104, 105, no test cell bond areas need to be provided, so that the gap area 123 is provided inside the test cell 101 only. A width of each of the test cell bond areas 142, 143, 144, 145 may be about one half of the extensions 109, 110 of the gap area 123.

In some embodiments, the test cell 101 may have an approximately square shape, wherein the extension 111 of the test cell 101 along the direction 113 and the extension 112 of the test cell 101 along the direction 114 are approximately 4.5 µm and the extensions 109, 110 of the gap area 123 are approximately 0.5 µm. The test cell 101 may be used when an area of more than about 4.5 µm is available for the test cell 101. In such embodiments, each of the test cell areas 102 to 105 has an approximately square shape with side lengths of approximately 2 µm.

In other embodiments, different dimensions may be provided, wherein extensions of the individual test cell areas 102-105 in the direction 114 may be greater than approximately 1.5 µm. This may help to avoid issues in OPC processes that are performed for providing reticle features on the basis of the target features of the pre-OPC layout 100.

The test cell area 102 may include a registration test pattern 116 that may be used for measuring a reticle registration and/or a process registration. In some embodiments, the registration test pattern 116 may include a cross-shaped target feature that may be provided approximately at a center of the test cell area 102.

The test cell area 103 may include a plurality of target features, wherein each of the target features in the test cell area 103 has a shape of an elongated line having a longitudinal direction substantially parallel to the direction 114 and extending across the test cell area 103 in the direction 114. In FIG. 1, reference numeral 120 exemplarily denotes one of the target features in the test cell area 103. The target features in the test cell area 103 may be arranged in a regular pattern, wherein a distance between adjacent ones of the target features in the test cell area 103 is approximately equal to a pitch 106.

The test cell area 104 may include a plurality of target features, each having the shape of an elongated line having a longitudinal direction substantially parallel to the direction 114 and extending across the test cell area 104 along the direction 114. In FIG. 1, reference numeral 121 exemplarily denotes one of the target features of the test cell area 104. The target features in the test cell area 104 may be arranged in a regular pattern, wherein a distance between adjacent ones of the target features in the test cell area 104 is approximately equal to a pitch 107.

The test cell area 105 may include a plurality of target features having a shape of an elongated line having a longitudinal direction substantially parallel to the direction 114 and extending across the test cell area 105 along the direction 114. In FIG. 1, reference numeral 122 exemplarily denotes one of the target features of the test cell area 105. The target features in the test cell area 105 may be arranged in a regular pattern, wherein a distance between adjacent ones of the target features in the test cell area 105 is approximately equal to a pitch 108.

The target features of the test cell area 105 may include printing protection features 140, 141, that are provided adjacent sides of the test cell area 105 that are substantially parallel to the direction 114. The printing protection features 140, 141 may have a greater width than the other target features of the test cell area 105 such as, for example, the exemplary target feature 122. Providing the printing protection features 140, 141 may help to improve a formation of photoresist features on the basis of the target features of the test cell area 105.

The pitches 106, 107, 108 of the respective target features in the test cell areas 103, 104, 105 may be different. In particular, the pitch 107 may be greater than the pitch 108, and the pitch 106 may be greater than each of the pitches 107, 108.

In some embodiments, widths of the target features in the test cell areas 103, 104, 105, being extensions of the target features in the direction 113 that is perpendicular to the longitudinal direction of the target features, may be approximately equal. In other embodiments, different widths of the target features may be provided in the test cell areas 103, 104, 105, for example, a width of the target features in the test cell area 103 may be greater than the width of the target features in the test cell area 104 and/or the width of the target features in the test cell area 104 may be greater than the width of the target features in the test cell area 105.

The pitches 106, 107, 108 of the target features in the test cell areas 103, 104, 105, respectively, may be selected so that they correspond to critical pitches in a photolithography process wherein the reticle 115 is used.

The pitch 108 may be determined on a basis of an anchor pitch of the photolithography process wherein the reticle 115 is used. The anchor pitch may correspond to a pitch between densely spaced features that are formed on a wafer by means of the photolithography process, wherein a magnification factor of a photolithography tool that is used for the photolithography process is considered. In some embodiments, the pitch 108 of the target features in the test cell area 105 may be approximately equal to a product between a pitch between densely spaced features that are to be formed on the wafer and a magnification factor of the photolithography tool.

The pitches 106, 107 may be determined on the basis of pitches that are problematic in the manufacturing of features on a wafer by means of the photolithography process wherein the reticle 115 is used. Such pitches are sometimes denoted as "forbidden pitch" in the technical field of photolithography. In some embodiments, the pitches 106, 107 are adapted so that pitches of features formed on the wafer on the basis of the target features in the test cell areas 103, 104 are different from the problematic pitches, for example, greater or smaller than the problematic pitches, but near the problematic pitches. In some embodiments, the pitches 106, 107 may be adapted so that pitches between photoresist features formed on the wafer differ from the problematic pitches by about 5 nm to about 50 nm, for example by about 10 nm, wherein, for providing the pitches 106, 107 on the reticle 115, the magnification factor of the photolithography tool may be considered.

Figure 2:
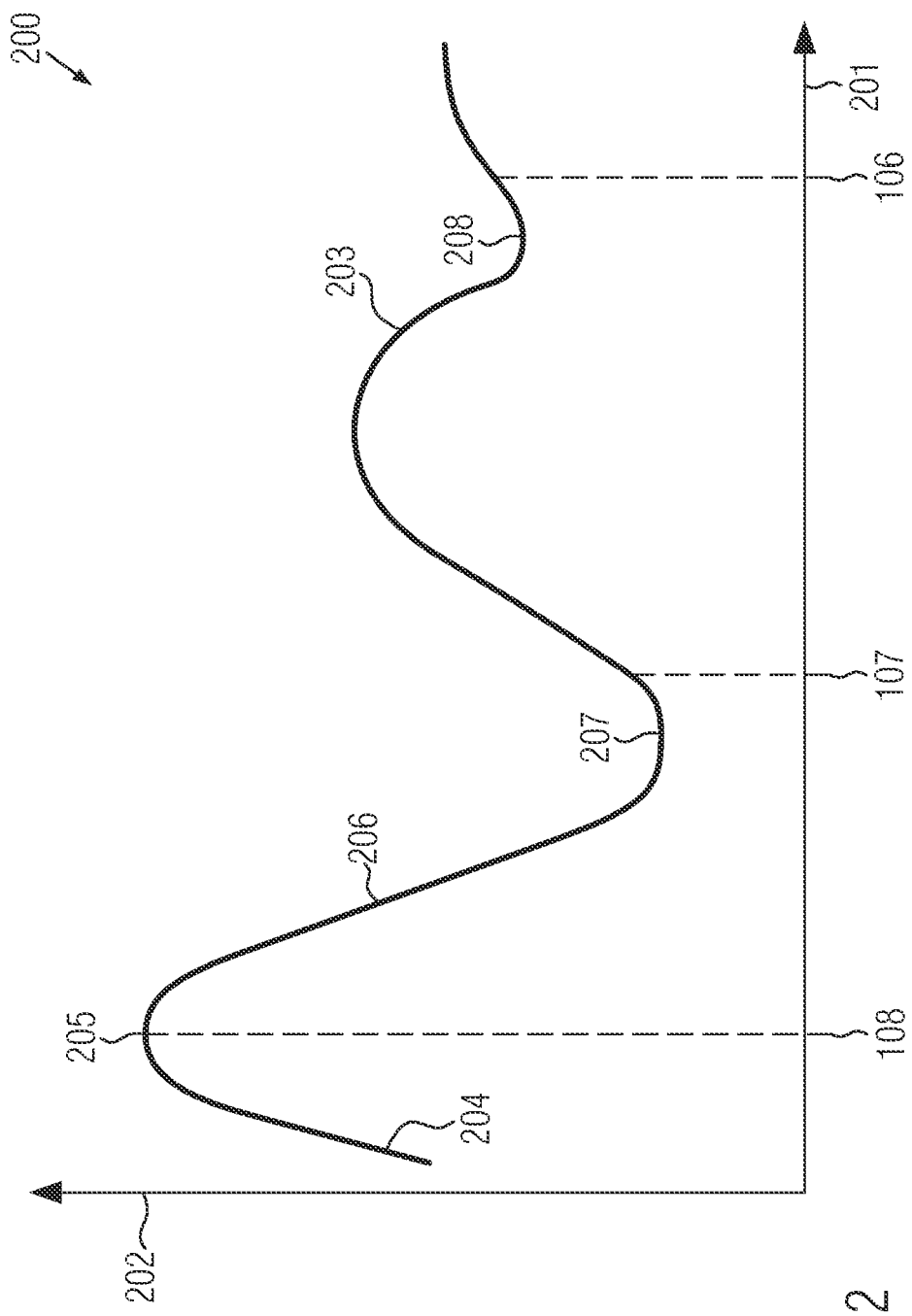
FIG. 2 shows a graph that schematically illustrates a dependency of a normalized image log slope on pitch.

FIG. 2 shows a graph 200 including a curve 203 that schematically illustrates a dependency of a normalized image log slope of an aerial image obtained by projecting a reticle including a regular pattern of line-shaped features on the pitch of the regular pattern of line-shaped features in a situation wherein an off-axis illumination using a dipole illumination pattern is used. In FIG. 2, a horizontal coordinate axis 201 denotes the pitch, and the vertical coordinate axis 202 denotes the normalized image log slope. The normalized image log slope is a measure for a quality of an aerial image that is well known in the technical field of photolithography, wherein greater values of the normalized image log slope correspond to a better quality of the aerial image.

For small values of the pitch, an increase of the normalized image log slope with pitch may be obtained at 204. The normalized image log slope may increase to a maximum 205, that is followed by a decrease of the normalized image log slope at 206. At greater pitches, the normalized image log slope may have local minima 207, 208.

FIGS. 3a-3d show schematic diagrams illustrating an entrance pupil 301 of an objective lens of a photolithography tool at pitch values as illustrated in the graph 200 of FIG. 2.

In FIGS. 3a-3d, reference numerals 302a, 302b denote locations of the zeroth diffraction orders of radiation from a dipole illumination aperture, corresponding to radiation that has passed substantially straight through the reticle. Reference numeral 302a denotes an area at which zeroth order radiation from a first opening of the dipole illumination aperture impinges on the entrance pupil and reference numeral 302b denotes an area at which zeroth order radiation from a second opening of the illumination aperture impinges on the entrance pupil.

Reference numerals 303a, 304a denote a first diffraction order and a second diffraction order, respectively, of radiation from the first opening of the illumination aperture that has been diffracted by the regularly spaced line-shaped features on the reticle, and reference numerals 303b, 304b denote a first diffraction order and a second diffraction order, respectively, of radiation from the second opening of the illumination aperture that was diffracted by the regularly spaced features on the reticle.

Figure 3B:
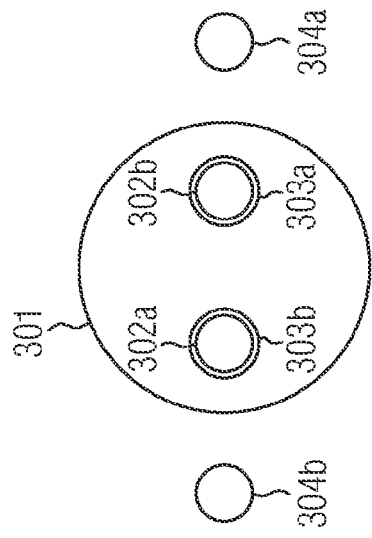
FIGS. 3a-3d schematically illustrate an entrance pupil of an objective lens of a photolithography tool and diffraction orders for different pitches.
Figure 3D:
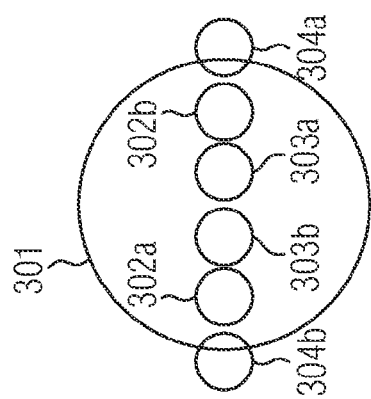
Figure 3A:
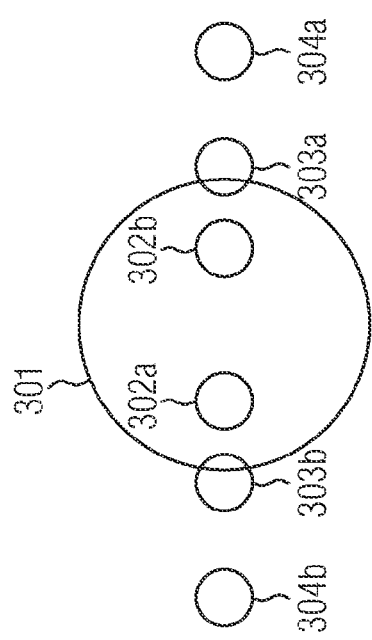

FIG. 3a schematically illustrates a situation at small pitch values to the left of the maximum 205 of the curve 203 that illustrates the dependency of the normalized image log slope on the pitch. The first diffraction orders 303a, 303b are captured by the entrance pupil. The second diffraction orders 304a, 304b are outside the entrance pupil so that radiation from the second diffraction orders does not enter the objective lens. As the pitch is increased, more radiation from the first diffraction orders 303a, 303b enters the entrance pupil 301, corresponding to the increase of the normalized image log slope at 204.

FIG. 3b shows a situation at a pitch between regularly spaced line-shaped features corresponding to the maximum 205 of the curve 203. Each of the first diffraction orders 303a, 303b of radiation from the openings of the dipole illumination aperture enters the entrance pupil 301 at substantially the same locations as the zeroth diffraction order from the respective other one of the openings of the dipole illumination aperture. The second diffraction orders 304a, 304b are still outside the entrance pupil 301. A situation as illustrated in FIG. 3b may correspond to a particularly high quality of the aerial image and a particularly high depth of focus.

In some embodiments, the pitch 108 between the target features of the test cell area 105 as well as the anchor pitch of the photolithography process may be selected so as to correspond to the maximum 205 of the curve 203 illustrating the dependency of the normalized image log slope on pitch that corresponds to a situation as illustrated in FIG. 3b. This may be done by providing an illumination aperture in the photolithography tool that is dimensioned in accordance with the pitch of densely spaced features that are to be formed on the wafer.

Figure 3C:
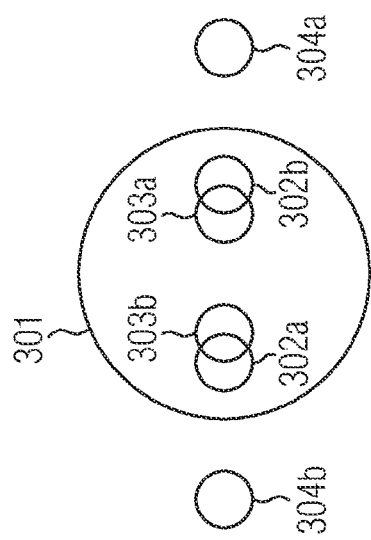

FIG. 3c illustrates a situation at pitches greater than the pitch value corresponding to the maximum at 205 and smaller than the pitch value corresponding to the minimum at 207 in the decreasing part of the curve 203 denoted by reference numeral 206 in FIG. 2. As the pitch is increased, the first diffraction orders 303a, 303b move closer to the center of the entrance pupil 301, which is typically associated with a reduction of the quality of the aerial image and the depth of focus. The second diffraction orders 304a, 304b are still outside the entrance pupil 301, and do not contribute to the quality of the aerial image.

FIG. 3d shows a situation at pitch values slightly greater than the pitch value corresponding to the minimum of the curve 203 at 207. At such pitch values, the second diffraction orders 304a, 304b are captured by the entrance pupil 301, which may be associated with an increase of the normalized image log slope, corresponding to a better quality of the aerial image.

The behavior of the normalized image log slope at greater pitch values, including the minimum at 208, may also be related to the location of diffraction orders relative to the entrance pupil, wherein diffraction orders greater than the second diffraction order may also contribute to the quality of the aerial image.

For pitches corresponding to the minima 207, 208 of the curve 203 illustrating the dependency of the normalized image log slope on the pitch, forming a regular arrangement of features on a wafer by means of a photolithography process may have some difficulties associated therewith. Therefore, the problematic pitch values corresponding to the minima 207, 208 are sometimes denoted as "first forbidden pitch" and "second forbidden pitch," respectively.

In some embodiments, the pitch 107 between the target features in the test cell area 104 of the test cell 100 may be provided on the basis of the first problematic pitch corresponding to the minimum at 207 of the curve 203 illustrating the dependency of the normalized image log slope on pitch that represents a first problematic pitch. In some embodiments, the pitch 107 may be determined for providing a pitch of features formed on the wafer that is near to the first problematic pitch, as described above.

In some embodiments, the pitch 106 between the target features in the test cell area 103 may be selected on the basis of the pitch corresponding to the minimum at 208 of the curve 203 illustrating the dependency of the normalized image log slope on pitch, which represents a second problematic pitch, wherein the pitch 106 may be provided on the basis of a pitch of features formed on the wafer that is near to the second problematic pitch, as described above.

In some embodiments, a curve such as curve 203 illustrated in FIG. 2 may be obtained by performing simulations of a photolithography process for different values of a pitch of a regular arrangement of features on the reticle, and wherein the normalized image log slope is determined for each of the pitches. Techniques for simulating a photolithography process are known.

The present disclosure is not limited to embodiments wherein a dipole illumination pattern is used. Dependencies of a curve illustrating a dependency of the normalized image log slope, or another quality measure of a photolithography process, on the pitch having maxima and minima may also be obtained for other illumination patterns, such as, for example, quadrupole illumination patterns, on-axis illumination patterns and/or ring-shaped illumination patterns, wherein, however, different pitch values of the maxima and minima may be obtained. In such embodiments, the pitch 108 in the test cell area 105 may be selected on the basis of the first maximum of the curve, and the pitches 106, 107 may be selected on the basis of pitch values of minima of the curve, which are representative of problematic pitches of the photolithography process.

Figure 4:
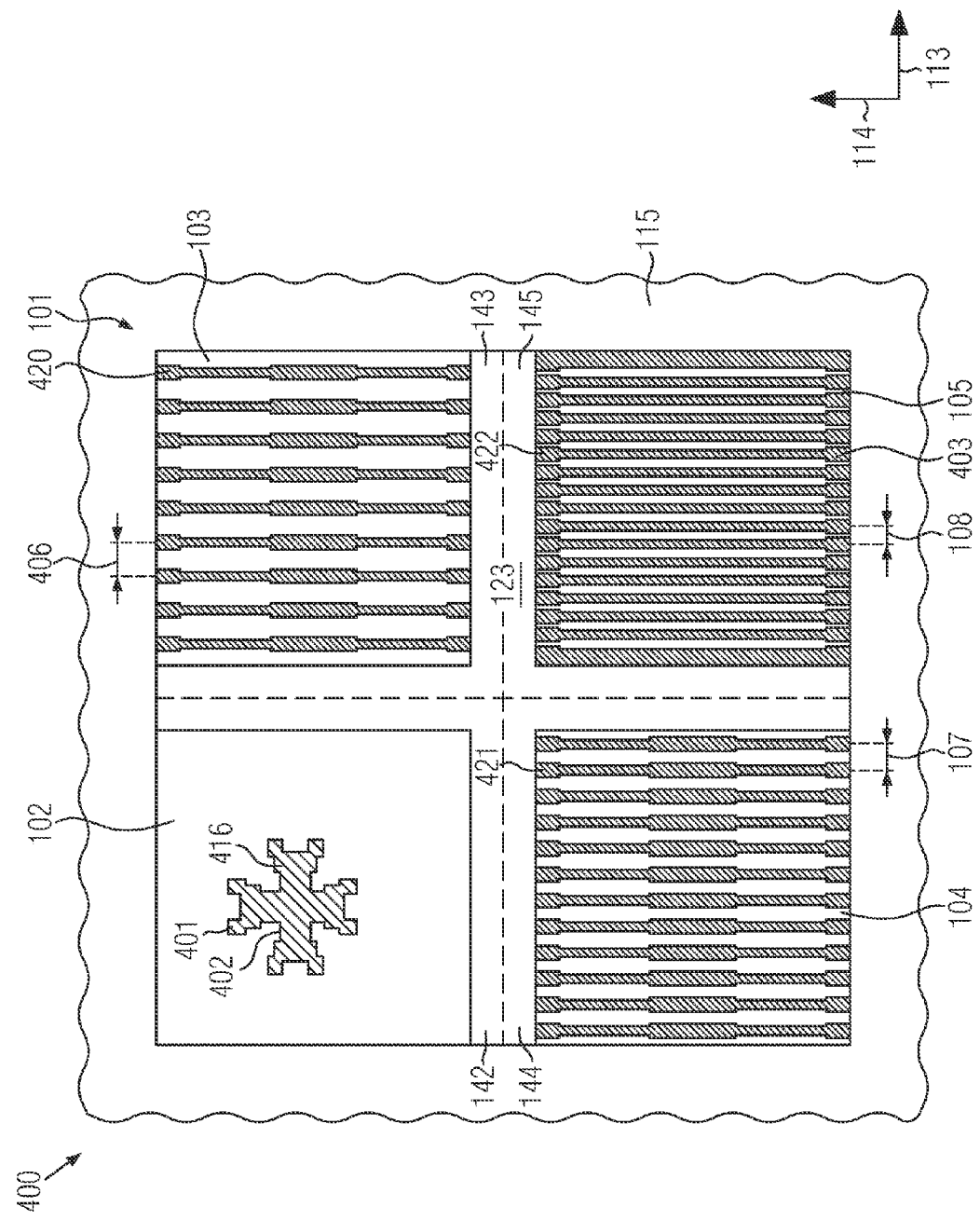
FIG. 4 shows a schematic view illustrating a post-OPC layout of the portion of the reticle shown in FIG. 1.
Figure 6A:
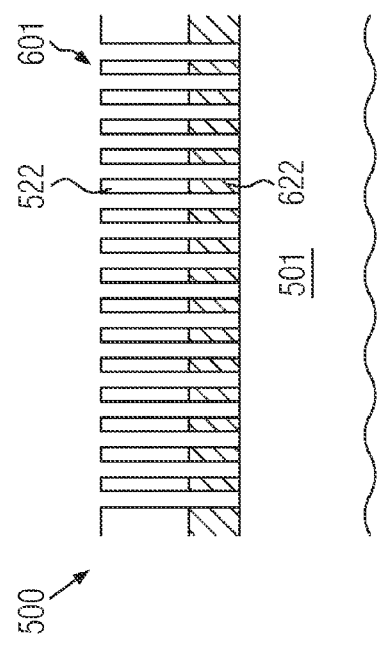
Figure 6B:
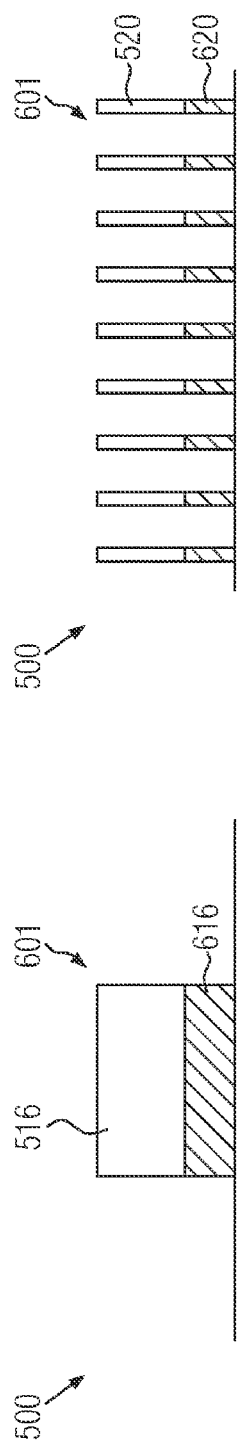
Figure 6C:
Figure 6D:
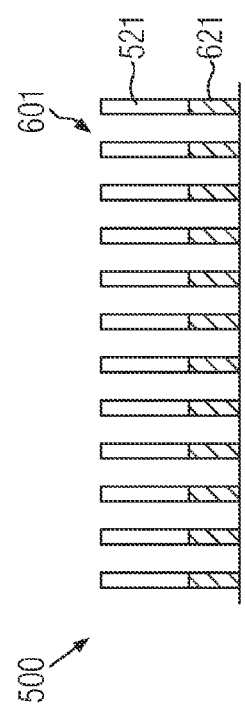

FIG. 4 shows a schematic view of a post-optical proximity correction (post-OPC) layout 400 of the portion of the reticle 115 that includes the test cell 101. The post-OPC layout 400 may be formed on the basis of the pre-OPC layout 100 shown in FIG. 1. The post-OPC layout 400 may be used in methods according to an embodiment for forming the reticle 115, wherein the post-OPC layout 400 defines shapes of reticle features that are formed on the reticle 115. For forming the reticle 115 on the basis of the post-OPC layout 400, known techniques for the formation of reticles, such as electron beam lithography, may be employed.

The post-OPC layout 400 may include a reticle feature 416 that is provided in the test cell area 102 on the basis of the registration test pattern 116 (FIG. 1). Additionally, the post-OPC layout 400 may include a plurality of reticle features in the test cell area 103 that are provided on the basis of the target features of the pre-OPC layout 100 in the test cell area 103. In FIG. 4, reference numeral 420 exemplarily denotes one of the reticle features in the test cell area 103 that may be provided on the basis of the exemplary target feature 120 shown in FIG. 1.

Similarly, the test call area 104 may include a plurality of reticle features that are provided on the basis of the target features of the pre-OPC layout 100 in the test cell area 104, and the test cell area 105 may include a plurality of reticle features that are provided on the basis of the target features of the pre-OPC layout 100 in the test cell area 105. In FIG. 4, reference numeral 421 exemplarily denotes a reticle feature in the test cell area 104 that may be provided on the basis of the exemplary target feature 121 and reference numeral 422 exemplarily denotes a reticle feature in the test cell area 105 that may be provided on the basis of the exemplary target feature 122.

For providing the reticle feature 416 in the test cell area 102 on the basis of the registration test pattern 116, a rule-based OPC process may be performed. The rule-based OPC process may modify the registration test pattern 116 on the basis of a predetermined set of OPC rules. In some embodiments, the rule-based OPC process may add serifs at convex corners of the registration test pattern 116, wherein one of the serifs is exemplarily denoted by reference numeral 401 in FIG. 4. At concave corners of the registration test pattern 116, the rule-based OPC process may remove parts of the registration test pattern 116 for providing negative serifs, one of which is exemplarily denoted by reference numeral 402 in FIG. 4.

Additionally, the rule-based OPC process may provide the reticle features of the post-OPC layout 400 in the test cell area 105 on the basis of the target features of the pre-OPC layout 100 in the test cell area 105. For this purpose, the post-OPC process may apply a set of OPC rules to the target features. In some embodiments, the rule-based OPC process may add serifs at line ends of the target features. In FIG. 4, one of the serifs at the reticle feature 422 is exemplarily denoted by reference numeral 403.

Further features of the rule-based OPC process may correspond to those of known rule-based OPC processes. The formation of the post-OPC layout 400 may further include performing a model-based OPC process. The model-based OPC process may provide the plurality of reticle features in the test cell area 103 on the basis of the target features in the test cell area 103, and it may also provide the plurality of reticle features in the test cell area 104 on the basis of the plurality of target features in the test cell area 104.

In the model-based OPC process, a simulation of a photolithography process may be performed, and the shapes of the target features in the test cell areas 103, 104 may be modified so that shapes of photoresist features obtained in the photolithography process more closely resemble the shapes of the target features in the test cell areas 103, 104 than photoresist features that would be obtained by using reticle features having shapes that are identical to the shapes of the target features.

Further features of the model-based OPC process may correspond to those of known model-based OPC processes. As schematically illustrated in FIG. 4, in the model-based OPC process, relatively complicated shapes of the reticle features in the test cell areas 103, 104 may be obtained, which may be helpful in the formation of photoresist features at the pitches 106, 107 that are near the second problematic pitch and the first problematic pitch, respectively, of the photolithography process.

At the pitch 108 provided in the test cell area 105, forming reticle features by means of a rule-based OPC process may be sufficient for obtaining a good quality of photoresist features on a wafer since, as discussed above with reference to FIGS. 2 and 3a-3d, at such pitch values, a particularly high quality of the aerial image of the reticle may be obtained. Furthermore, performing a rule-based OPC process may be sufficient for the registration test pattern 116.

In some embodiments, the rule-based OPC process may be performed separately for the combination of the test cell area 102 and the test cell bond area 142, and for the combination of the test cell area 105 and the test cell bond area 145. In such embodiments, the rule-based OPC process may be applied to a section of the pre-OPC layout 100, being denoted as a first "chip" that includes the test cell area 102 and the test cell bond area 142. Additionally, the rule-based OPC process may be applied to another section of pre-OPC layout 100, being denoted as a second "chip" that includes the test cell area 105 and the test cell bond area 145.

Similarly, the model-based OPC process may be performed separately for the combination of the test cell area 103 and the test cell bond area 143, and for the combination of the test cell area 104 and the test cell bond area 144. For this purpose, the model-based OPC process may be applied to a section of the pre-OPC layout 100, being denoted as a third "chip" that includes the test cell area 103 and the test cell bond area 143. Additionally, the model-based OPC process may be applied to another section of the pre-OPC layout 100, being denoted as a fourth "chip" that includes the test cell area 104 and the test cell bond area 144.

Then, the post-OPC layout 400 may be provided by combining two sections of the post-OPC layout 400 that were obtained by applying the rule-based OPC process to the first and second chip, respectively, and two further sections of the post-OPC layout that were obtained by applying the model-based OPC process to the third and fourth chip, respectively, with each other.

After the formation of the post-OPC layout 400, the reticle 115 may be manufactured in accordance with the post-OPC layout 400, wherein the reticle 115 includes the reticle features of the test cell 101. The test cell 101 may be provided in a die area of the reticle 115. In portions of the die area adjacent to the test cell, reticle features that are employed for the formation of photoresist features on a wafer that are used in the formation of circuit features of an integrated circuit may be formed. Accordingly, the test cell 101 need not be provided in a scribe line area between adjacent dies on the wafer. In some embodiments, the reticle 115 may have a plurality of die areas, and a test cell having features corresponding to those of the test cell 101 may be formed in each of the die areas.

After the formation of the reticle 115, a reticle critical dimension uniformity (CDU) measurement may be performed at the reticle 115. In the reticle CDU measurement, the test cell area 105 including the reticle features having the pitch 108 that were obtained by means of the rule-based OPC process may be investigated by means of known techniques for reticle CDU measurement, such as electron beam microscopy and/or scatterometry. The reticle features in the test cell area 105 that were obtained by means of the rule-based OPC process may be particularly suitable for performing reticle CDU measurements since the rule-based OPC processes may provide more regular shapes of reticle features than the model-based OPC process. In the measurement of the reticle CDU, a critical dimension of the reticle features in the test cell area 105, for example a width of the reticle features in the test cell area 105 and/or the pitch between the reticle features in the test cell area 105, may be measured, and a comparison with desired values thereof may be performed for assessing a quality of the manufacturing of the reticle.

The reticle formed on the basis of the post-OPC layout 400 may also be used for performing wafer CDU measurements and registration measurements, as will be described with reference to FIGS. 5a to 7d.

FIGS. 5a to 7d show schematic cross-sectional views of portions of a wafer 500 in stages of a method according to an embodiment wherein the reticle 115 formed on the basis of the post-OPC layout 400 is employed for performing wafer CDU measurements and/or reticle registration measurements. FIGS. 5a, 6a and 7a show schematic cross-sectional views of a portion of the wafer 500 to which the test cell area 102 is projected in a photolithography process, FIGS. 5b, 6b and 7b show schematic cross-sectional views of a portion of the wafer 500 to which the test cell area 103 is projected, FIGS. 5c, 6c and 7c show schematic cross-sectional views of a portion of the wafer 500 to which the test cell area 104 is projected, and FIGS. 5d, 6d and 7d show schematic cross-sectional views of a portion of the wafer 500 to which the test cell area 105 is projected. Each of the cross-sectional views of FIGS. 5a to 7d is taken along the direction 113, traverse to the direction of elongation of the reticle features in the test cell areas 103, 104, 105.

The wafer 500 may include a substrate 501. The substrate 501 may include a semiconductor wafer, for example a silicon wafer. In some embodiments, the substrate 501 may include circuit features formed in earlier stages of a semiconductor manufacturing process such as, for example, trench isolation structures and doped active regions of field effect transistors whose formation will be completed in later stages of the manufacturing process. In other embodiments, the substrate 501 may include substantially complete field effect transistors and/or one or more interlayer dielectric layers over the field effect transistors, which may optionally include electrically conductive metal lines.

A material layer 502 may be deposited over the substrate 501. In some embodiments, the material layer 502 may include a gate electrode material from which gate electrodes of field effect transistors and/or dummy gate electrodes employed in the formation of gate electrodes of field effect transistors by means of a replacement gate process are formed, for example, polysilicon. Additionally the material layer 502 may include a layer of a gate insulation material below the gate electrode material, for example, silicon dioxide and/or a high-k dielectric material. The material layer 502 may be deposited by means of known deposition processes, such as atomic layer deposition, chemical vapor deposition and/or plasma-enhanced chemical vapor deposition.

In other embodiments, the material layer 502 may include a layer of an interlayer dielectric that is deposited above substantially complete field effect transistors in the substrate 501, and wherein electrically conductive metal lines and/or contact vias filled with an electrically conductive material will be formed. In such embodiments, the material layer 502 may include an electrically insulating material such as, for example, silicon dioxide and/or a low-k interlayer dielectric material, and it may be formed by means of chemical vapor deposition, plasma-enhanced chemical vapor deposition and/or spin coating.

A photoresist layer 503 may be formed over the material layer 502. For this purpose, known techniques for forming a photoresist layer, such as spin coating, may be used.

Thereafter, a photolithography process may be performed. In the photolithography process, the reticle 115 may be inserted into the optical path of a photolithography tool, and the reticle may be projected to the photoresist layer 503 by means of the photolithography tool for exposing the photoresist layer 503.

In doing so, portions of the photoresist layer 503 may be irradiated with radiation, for example ultraviolet light, that is schematically denoted by reference numeral 504 in FIGS. 5a-5d. The reticle features of the reticle 115 which include, in particular, the reticle features in the test cell areas 102, 103, 104, 105, may prevent the radiation used in the photolithography process from reaching the photoresist layer 503 so that the photoresist layer 503 is not exposed at locations to which the reticle features are projected. Thus, unexposed portions of the photoresist layer 503 are obtained. In FIG. 5a, reference numeral 516 denotes an unexposed portion of the photoresist layer 503 corresponding to reticle feature 416. In FIG. 5b, reference numeral 520 exemplarily denotes an unexposed portion of the photoresist layer 503 corresponding to the reticle feature 420. In FIGS. 5c and 5d, reference numerals 521 and 522 exemplarily denote unexposed portions of the photoresist layer 503 corresponding to the reticle feature 421 and the reticle feature 422, respectively.

FIGS. 6a-6d show schematic cross-sectional views of the wafer 500 in a later stage of the method. After exposing the photoresist layer 503, a photoresist development process may be performed. In the photoresist development process, the exposed portions of the photoresist layer 503 may be removed. The unexposed portions of the photoresist layer 503 remain on the wafer 500 and form a photoresist mask 601 that includes photoresist features corresponding to the reticle features of the reticle 115, which are based on the target features of the pre-OPC layout 100.

In some embodiments, after the photoresist development process, wafer CDU measurements may be performed, wherein dimensions of the photoresist features formed on the basis of the reticle features in the test cell areas 103, 104, 105 are measured. This may be done by means of wafer CDU measurement techniques, such as electron microscopy and/or scatterometry.

By measuring dimensions of features formed on the basis of the reticle features in the test cell area 105, critical dimensions of dense photoresist features may be measured. By measuring dimensions of features formed on the basis of reticle features in the test cell areas 103, 104, critical dimensions of photoresist features near the first and second problematic pitch may be measured for assessing a performance of the photolithography process at pitches having difficulties associated therewith.

Thereafter, an etch process may be performed, wherein portions of the material layer 502 that are not covered by the photoresist mask 601 are removed. Thus, features corresponding to the reticle features of the reticle 115 that are based on the target features of the pre-OPC layout 100 may be formed from the material layer 502. In FIGS. 6a, 6b, 6c and 6d, reference numeral 616 schematically denotes a feature formed from the material layer 502 corresponding to the reticle feature 416 and the target feature providing the registration test pattern 116, and the reference numerals 620, 621, 622 schematically denote features formed from the material layer 502 corresponding to the exemplary reticle features 420, 421, 422 that are based on the exemplary target features 120, 121, 122. After the etch process, the photoresist mask 601 may be removed by means of a resist strip process.

Thereafter, dimensions of the features formed from the material layer 502 on the basis of the reticle features of the reticle 115 in the test cell areas 103, 104, 105 may be measured using techniques such as electron microscopy and/or scatterometry. Such measurements may allow a determination of a wafer CDU and/or a monitoring of the etch process.

Measurements that are performed on the basis of features formed from the material layer 502 on the basis of the reticle features of the reticle 115 in the test cell area 103, that are adapted for providing a pitch near the second forbidden pitch, may have a relatively high sensitivity for a photolithography process, so that a monitoring of the photolithography process may be performed using the test cell area 103.

Performing measurements both on the basis of features formed from the material layer 502 on the basis of the reticle features in the test cell area 103, that are adapted for providing a pitch near the second forbidden pitch, and on the basis of the reticle features in the test cell area 104, that are adapted for providing a pitch near the first forbidden pitch, may allow a monitoring of etch processes at different local densities of features.

In particular, pitches of features that correspond to the pitches 106, 107 of the target features and the reticle features in the test cell areas 103, 104 may be sensitive to both mask errors and process errors, and performing measurements at the features formed from the material layer 502 at portions of the wafer 501 corresponding to the test cell areas 103, 104 may allow a precise monitoring of a performance of the combination of the processes of photolithography and etching.

FIGS. 7a-7d show schematic cross-sectional views of the wafer 500 in a later stage of the method. A material layer 701 may be deposited over the wafer 500. The material layer 701 may include an electrically insulating material such as, for example, silicon dioxide, and it may be formed, in particular, in embodiments wherein the material layer 502 includes a gate electrode or dummy gate electrode material such as polysilicon. After the deposition of the material layer 701, a chemical mechanical polishing process may be performed for exposing the features formed from the material layer 502 on the basis of the reticle features of the reticle 115. Thereafter, dimensions of the features formed on the basis of some or all of the reticle features in the test cell 101 may be measured using techniques of electron microscopy and/or scatterometry, for determining an erosion of the features in the chemical mechanical polishing process. In some embodiments, measurements for determining an erosion of features in the chemical mechanical polishing process may be performed at features formed on the basis of the reticle features in the test cell area 103. These features may have a relatively large pitch, which may simplify the measurements. In other embodiments, the formation of the material layer 701, the chemical mechanical polishing process and the erosion measurements may be omitted.

In some embodiments, registration measurements and process registration measurements may be performed at various stages of the method described above on the basis of the test cell area 102. For this purpose, known techniques for the measurement of reticle registration and process registration may be used.

The present disclosure is not limited to embodiments wherein four test cell areas are provided in the test cell, as described above. In other embodiments, a different number of test cell areas may be provided. In the following, embodiments wherein three test cell areas are provided in a test cell will be described with reference to FIG. 8.

Figure 8:
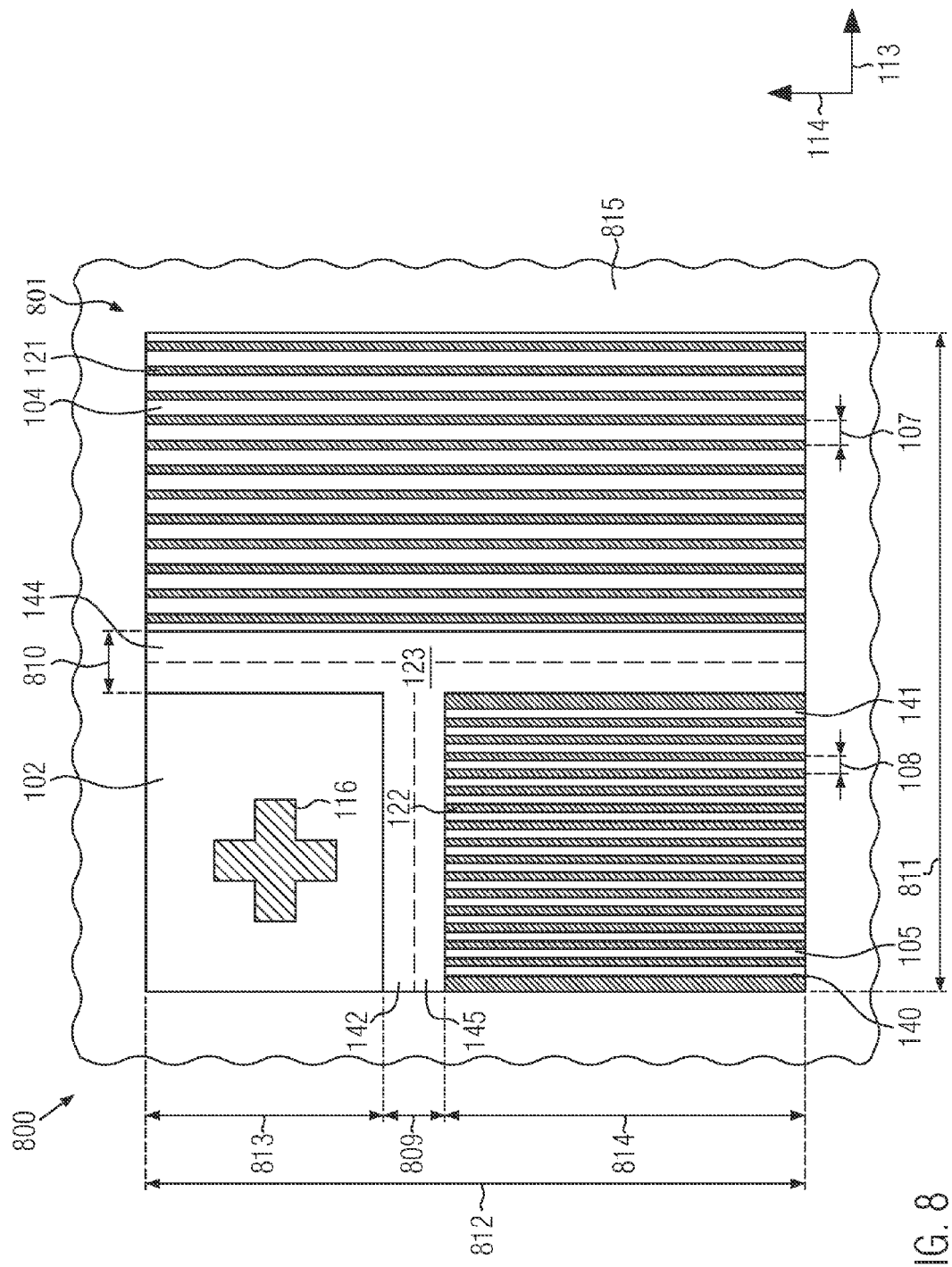
FIG. 8 shows a schematic view illustrating a pre-OPC layout of a portion of a reticle according to an embodiment.

FIG. 8 shows a schematic view of a pre-OPC layout 800 of a portion of a reticle 815. For convenience, in FIGS. 1 and 8, like reference numerals have been used to denote like components. Unless explicitly stated otherwise, components denoted by like reference numerals may have corresponding features.

The pre-OPC layout 800 includes a test cell 801. The test cell 801 includes test cell areas 102, 104, 105. The test cell area 102 may include a target feature that forms a registration test pattern 116. The registration test pattern 116 may be used for measuring a reticle registration and/or a process registration.

The test cell area 104 may include a plurality of target features, each having a shape of an elongated line having a longitudinal direction substantially parallel to a direction 114. Reference numeral 121 exemplarily denotes one of the target features in the test cell area 104. The target features in the test cell area 104 may be arranged in a regular pattern, wherein a distance between adjacent ones of the target features in the test cell area 104 in a direction 113 that is perpendicular to the direction 114 is substantially equal to a pitch 107. The pitch 107 may be provided on the basis of a first problematic pitch of a photolithography process wherein the reticle 815 is to be used, for providing a pitch of features on the wafer that are near the first problematic pitch. For example, the pitch 107 may be provided on the basis of the minimum 207 of the curve 203 in the graph 200 shown in FIG. 2 that illustrates a dependency of the quality of an aerial image on the pitch of a regular arrangement of patterns on a reticle.

The test cell area 105 may include a plurality of target features, each having a shape of an elongated line having a longitudinal direction substantially parallel to the direction 114. Reference numeral 122 exemplarily denotes one of the target features in the test cell area 105. The target features in the test cell area 105 may be arranged in a regular pattern, wherein a distance between adjacent ones of the target features in the direction 113 that is perpendicular to the direction 114 is substantially equal to a pitch 108. The pitch 108 may be provided on the basis of an anchor pitch of the photolithography process wherein the reticle 815 is to be used. In some embodiments, the pitch 108, which may represent a distance between dense features that are to be formed in the photolithography process wherein the reticle 815 is used, may correspond to the maximum 205 of the curve 203 shown in FIG. 2 that illustrates a dependency of the quality of an aerial image formed in the photolithography process on the pitch. Accordingly, the pitch 107 between the target features in the test cell area 104 may be greater than the pitch 108 between the target features in the test cell area 105. In some embodiments, the target features in the test cell area 105 may include printing protection features 140, 141 having a greater width than other target features in the test cell area 105.

Between the test cell areas 102, 104, 105, a gap area 123 having an extension 809 in the direction 114 and an extension 810 in the direction 113 may be provided that separates adjacent ones of the test cell areas 102, 104, 105. The gap area 123 may be provided by a test cell bond area 142 of the test cell area 102, a test cell bond area 144 of the test cell area 104 and a test cell bond area 145 of the test cell area 105.

The test cell areas 102, 105 may be arranged adjacent to each other along the direction 114. An extension 814 of the test cell area 105 in the direction 114 may be greater than an extension 813 of the test cell area 102 in the direction 114. Thus, a greater fraction of an extension 812 of the test cell 801 in the direction 114 may be used for providing the regular arrangement of target features in the test cell area 105, whereas a smaller amount of space may be sufficient for providing the registration test pattern 116.

The test cell area 104 may extend along substantially the entire extension 812 of the test cell 801 in the direction 114. Thus, the test cell area 102 and the test cell area 104 are arranged adjacent to each other along the direction 113, and the test cell areas 104, 105 are also arranged adjacent to each other along the direction 113.

In some embodiments, the test cell 801 may have an approximately square shape, wherein an extension 811 of the test cell 801 in the direction 813 is approximately equal to the extension 812 of the test cell 801 in the direction 114. In some embodiments, the extensions 811, 812 of the test cell 801 may be approximately 2.5 µm. The extensions 809, 810 of the gap area 123 in the directions 114, 113 may be about 0.5 µm, the extension 814 of the test cell area 105 in the direction 114 may be about 1.5 µm, and the extension 813 of the test cell area 102 in the direction 114 may be about 0.5 µm. The test cell 801 may be particularly suitable when a small area is available for in-die test cells, for example an area of about 2.5 µm times about 2.5 µm or more.

The pre-OPC layout 800 may be used for forming a post-OPC layout of a portion of the reticle 815. For forming the post-OPC layout, a rule-based OPC process may be performed for forming reticle features on the basis of the target feature providing the registration test pattern 116 in the test cell area 102 and the plurality of target features in the test cell area 105. A model-based OPC process may be performed for forming a plurality of reticle features on the basis of the plurality of target features in the test cell area 104. Features of the rule-based OPC process and the model-based OPC process may correspond to those described above in the context of FIG. 4.

Then, the reticle 815 may be formed on the basis of the post-OPC layout, and a measurement of a reticle CDU may be performed, wherein the test cell area 105 is used. Then, methods as described above with reference to FIGS. 5a to 7d may be performed for performing measurements of a wafer CDU, process monitoring measurements and/or erosion measurements, wherein both the test cell area 104 and the test cell area 105 may be used.

The present disclosure is not limited to embodiments wherein a single exposure of a photoresist layer is performed. In other embodiments, multiple exposures may be performed, wherein two or more exposures of the photoresist layer are performed, for example, double exposures wherein two exposures are performed. In such embodiments, two or more reticles may be formed, wherein each of the reticles is used for exposing a photoresist layer similar to the photoresist layer 503 shown in FIGS. 5a-5d. After the completion of all exposures of the photoresist layer, processes of photoresist development, etching, chemical mechanical polishing, wafer CDU measurements and measurements of erosion processes as described above with reference to FIGS. 5a to 7d may be performed.

Figure 9A:
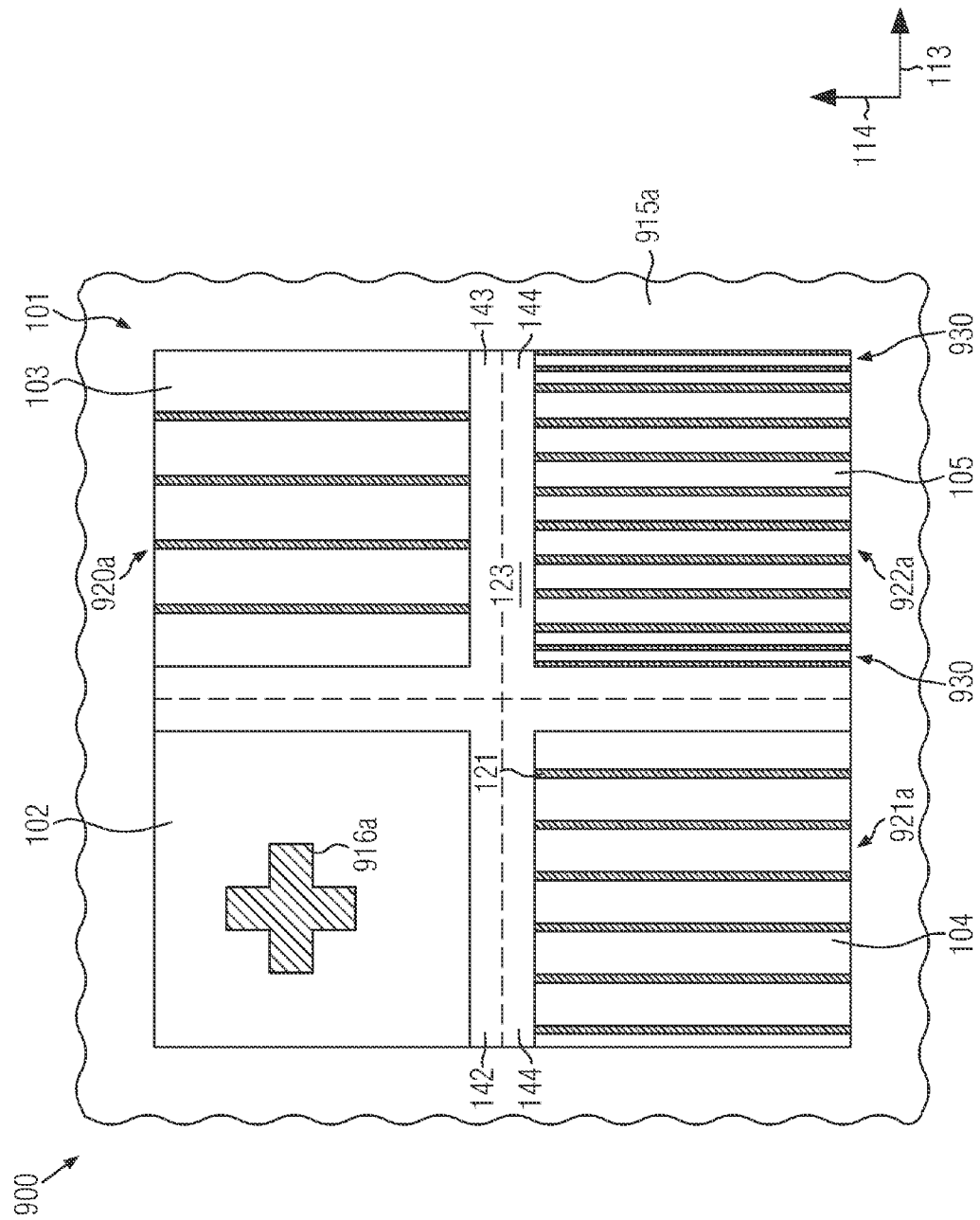
FIGS. 9a-9b show schematic views illustrating a pre-OPC layout of portions of two reticles according to an embodiment.
Figure 9B:
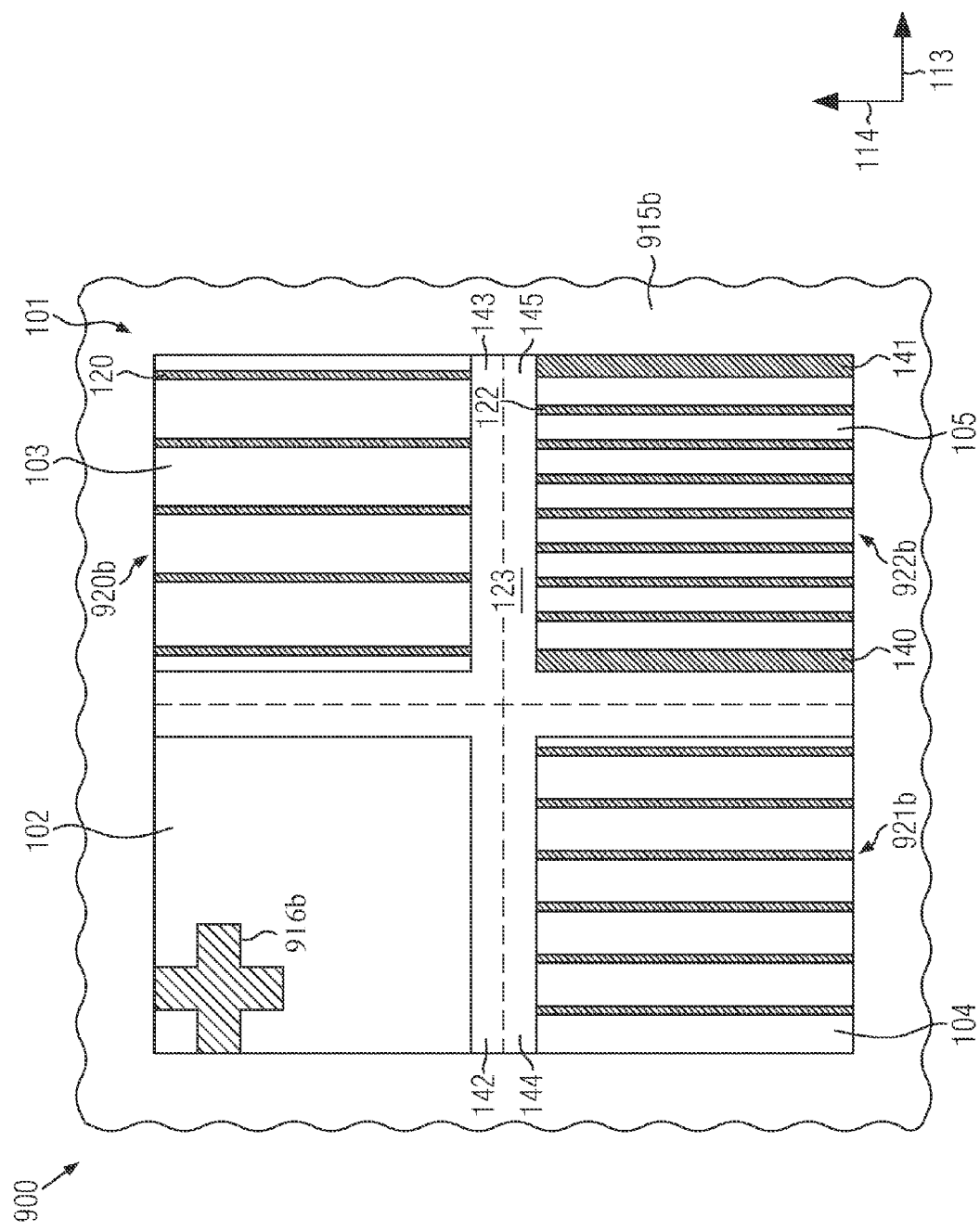

FIGS. 9a and 9b show a pre-OPC layout 900 including pre-OPC layouts of portions of a reticle 915a (FIG. 9a) and a reticle 915b (FIG. 9b). For convenience, in FIG. 1, on the one hand, and in FIGS. 9a and 9b, on the other hand, like reference numerals have been used to denote like components. Unless explicitly stated otherwise, components denoted by like reference numerals may have corresponding features.

The reticle 915a may be used for one of the two exposures of a photoresist layer in a double patterning process, and the reticle 915b may be used in the other exposure of the photoresist layer. The pre-OPC layout 900 includes a test cell 101. The test cell 101 may include a plurality of target features, wherein reticle features corresponding to a first part of the target features may be formed on the reticle 915a, and reticle features corresponding to a second part of the target features may be formed on the reticle 915b. Target features corresponding to reticle features that are formed on the reticle 915a are shown in FIG. 9a, and target features corresponding to reticle features that are formed on the reticle 915b are shown in FIG. 9b. The combination of the target features for both reticles 915a, 915b may provide an arrangement of target features as described above with reference to FIG. 1.

The test cell 101 may include test cell areas 102, 103, 104, 105 and a gap area 123 that is arranged between adjacent ones of the test cell areas 102, 103, 104, 105.

In the test cell area 102, a target feature 916a and a target feature 916b may be provided, wherein the combination of the target features 916a, 916b provides a registration test pattern.

In the test cell areas 103, 104, 105, target features corresponding to the target features in the test cell areas 103, 104, 105 of the pre-OPC layout 100 described above with reference to FIG. 1 may be provided.

A first subset 920a of the target features in the test cell area 103 may be provided in the pre-OPC layout of the reticle 915a, and a second subset 920b of the target features in the test cell area 103 may be provided in the pre-OPC layout of the reticle 915b. For example, the exemplary target feature 120 described above with reference to FIG. 1 may be included into the second subset 920b of the target features of the test cell area 103.

The pre-OPC layout of the reticle 915a may further include a first subset 921a of the target features in the test cell area 104 and a first subset 922a of the target features in the test cell area 105. The pre-OPC layout of the reticle 915b may further include a second subset 921b of the target features in the test cell area 104 and a second subset 922b of the target features in the test cell area 105. For example, the exemplary target feature 121 in the test cell area 104 may be included into the first subset 921a of the target features of the test cell area 104, and the exemplary target feature 122 in the test cell area 105 may be included into the second subset 922b of the target features of the test cell area 105.

In some embodiments, assist features 930 may additionally be provided in some or all of the test cell areas 102, 103, 104, 105, as exemplarily shown for the test cell area 105 in FIG. 9a. The assist features 930 may have dimensions that are adapted such that, when reticle features are formed on the basis of the assist features 930, and the reticle including the reticle features is used in a photolithography process, no photoresist features corresponding to the assist features 930 are formed. However, the assist features 930 may help to improve a quality of the photolithography process.

Further features of the pre-OPC layout 900 described above with reference to FIGS. 9a and 9b, including dimensions of the test cell 101 and pitches, may correspond to features of the pre-OPC layout 100 described above with reference to FIG. 1.

The pre-OPC layout 900 of the reticle 915a and the reticle 915b may be used for forming a post-OPC layout for the reticles 915a, 915b. For each of the reticles 915a, 915b, a rule-based OPC process may be performed for providing reticle features for the test cell areas 102, 105 on the basis of the target features of the test cell areas 102, 105, and a model-based OPC process may be used for providing reticle features for the test cell areas 103, 104 on the basis of the target features for the test cell areas 103, 104. Features of the rule-based OPC process and the model-based OPC process may correspond to those described above in the context of FIG. 4.

Figure 10A:
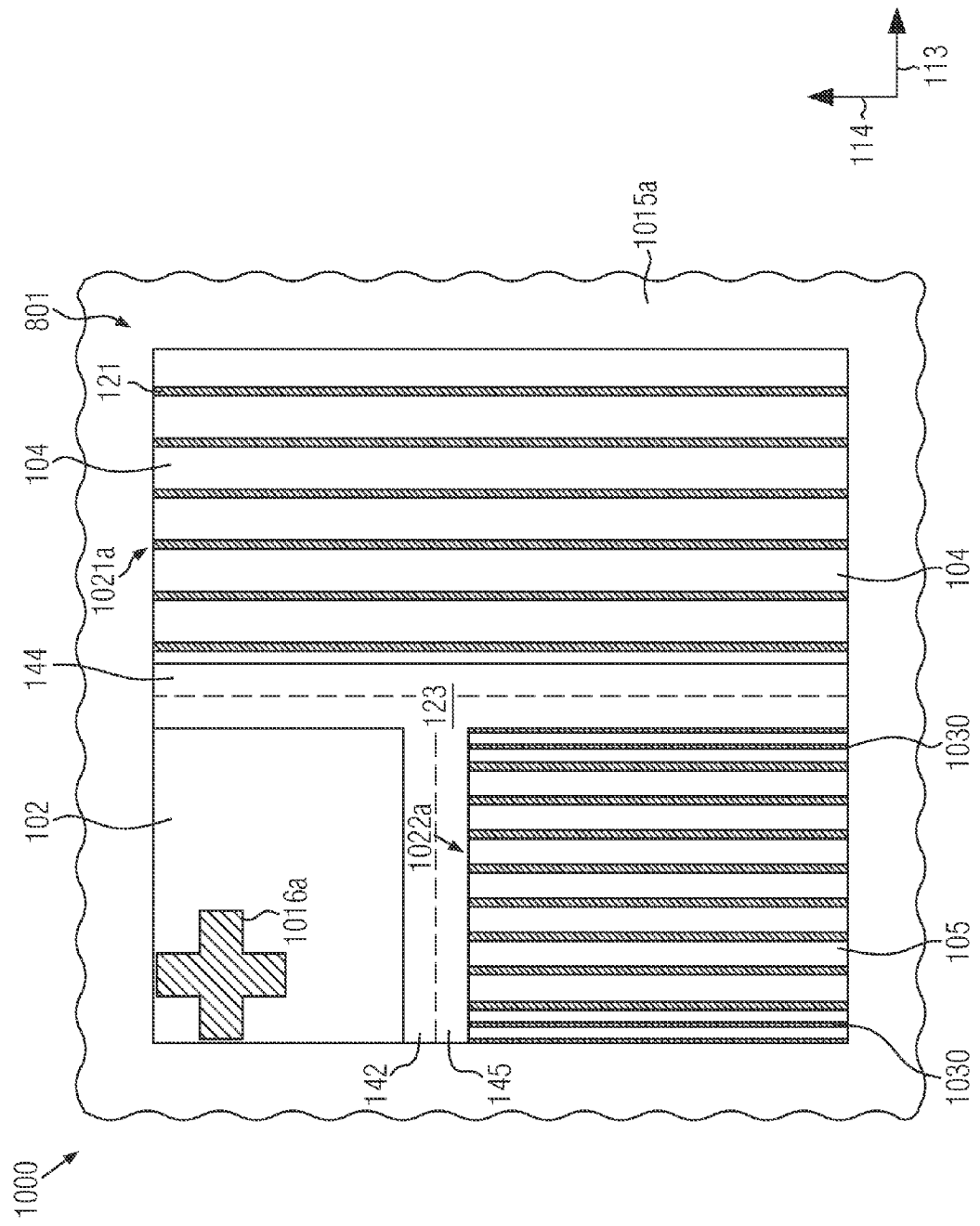
FIGS. 10a-10b show schematic views illustrating a pre-OPC layout of portions of two reticles according to an embodiment.
Figure 10B:
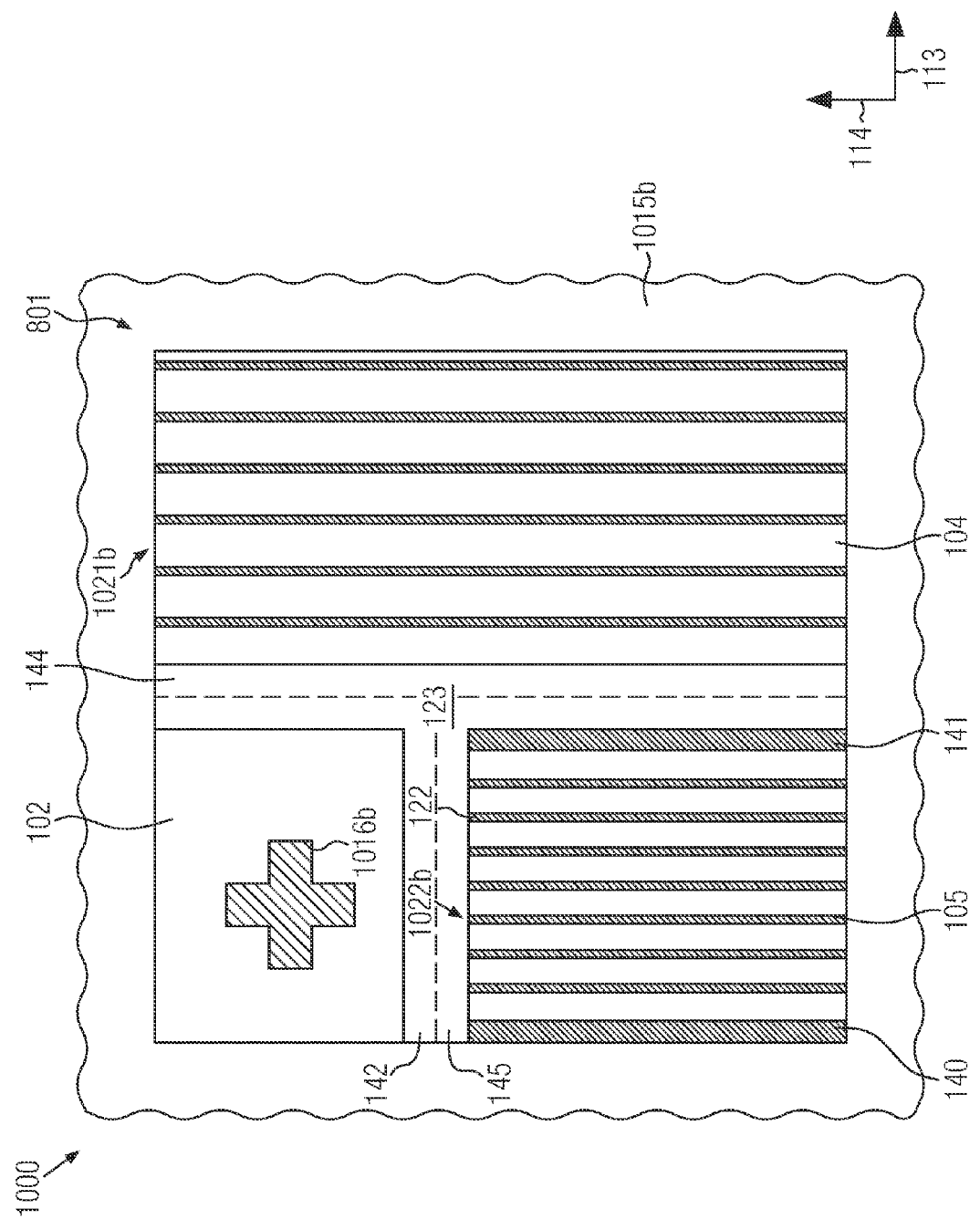

FIGS. 10a and 10b show a pre-OPC layout 1000 that includes a pre-OPC layout of a reticle 1015a (shown in FIG. 10a) and a pre-OPC layout of a reticle 1015b (shown in FIG. 10b). The pre-OPC layout 1000 includes a test cell 801, wherein a part of a plurality of target features of the test cell 801 are provided in the pre-OPC layout for the reticle 1015a, and another part of the plurality of target features of the test cell 801 are provided in the pre-OPC layout for the reticle 1015b. The combination of both parts of the target features may provide an arrangement similar to the arrangement described above with reference to FIG. 8. For convenience, in FIG. 8, on the one hand, and in FIGS. 10a and 10b, on the other hand, like reference numerals have been used to denote like components.

The test cell 801 includes test cell areas 102, 104, 105, wherein a gap area 123 may be provided between adjacent ones of the test cell areas 102, 104, 105.

In the test cell area 102, target features 1016a, 1016b that form a registration test pattern may be provided, wherein the target feature 1016a may be provided in the pre-OPC layout for the reticle 1015a, and the target feature 1016b may be provided in the pre-OPC layout for the reticle 1015b.

The pre-OPC layout for the reticle 1015a may include a first subset 1021a of a plurality of target features in the test cell area 104 and a first subset 1022a of a plurality of target features in the cell area 105. The pre-OPC layout for the reticle 1015b may include a second subset 1021b of the plurality of target features in the test cell area 104 and a second subset 1022b of the plurality of target features in the test cell area 105. The combination of the subsets 1021a, 1021b of the plurality of target features in the test cell area 105 may provide an arrangement of target features in the test cell area 105 as described above with reference to FIG. 8, and the combination of the subsets 1022a, 1022b of the target features in the test cell area 104 may provide an arrangement of target features in the test cell area 104 as described above with reference to FIG. 8.

In addition, in some or all of the test cell areas 102, 104, 105, assist features may be provided. Exemplarily, in FIG. 10a, assist features 1030 in the test cell area 105 are shown.

The pre-OPC layout 1000 may be used for forming a post-OPC layout of the reticle 1015a and a post-OPC layout of the reticle 1015b, wherein reticle target features for the test cell areas 102, 105 may be provided by means of a rule-based OPC process, and reticle target features for the test cell area 104 may be provided by means of a model-based OPC process. Features of the rule-based OPC process and the model-based OPC process may correspond to those described above in the context of FIG. 4.

In further embodiments, the target features of the pre-OPC layout 100 shown in FIG. 1 and/or the target features of the pre-OPC layout 800 shown in FIG. 8 may be split into more than two subsets for providing pre-OPC layouts for more than two reticles that are used in multiple exposure processes wherein more than two exposures are performed.

The present disclosure is not limited to embodiments wherein target features in the test cell areas of the test cell have a shape of an elongated line, as described above. In other embodiments, target features having a shape adapted for the formation of contact vias may be provided in test cell areas of an in-die test cell. In the following, such embodiments will be described with reference to FIGS. 11 and 12. Reticles including test cells as described in the following with reference to FIGS. 11 and 12 may be used in processes wherein metal-filled contact vias providing electrical connections between electrically conductive metal lines are formed.

Figure 11:
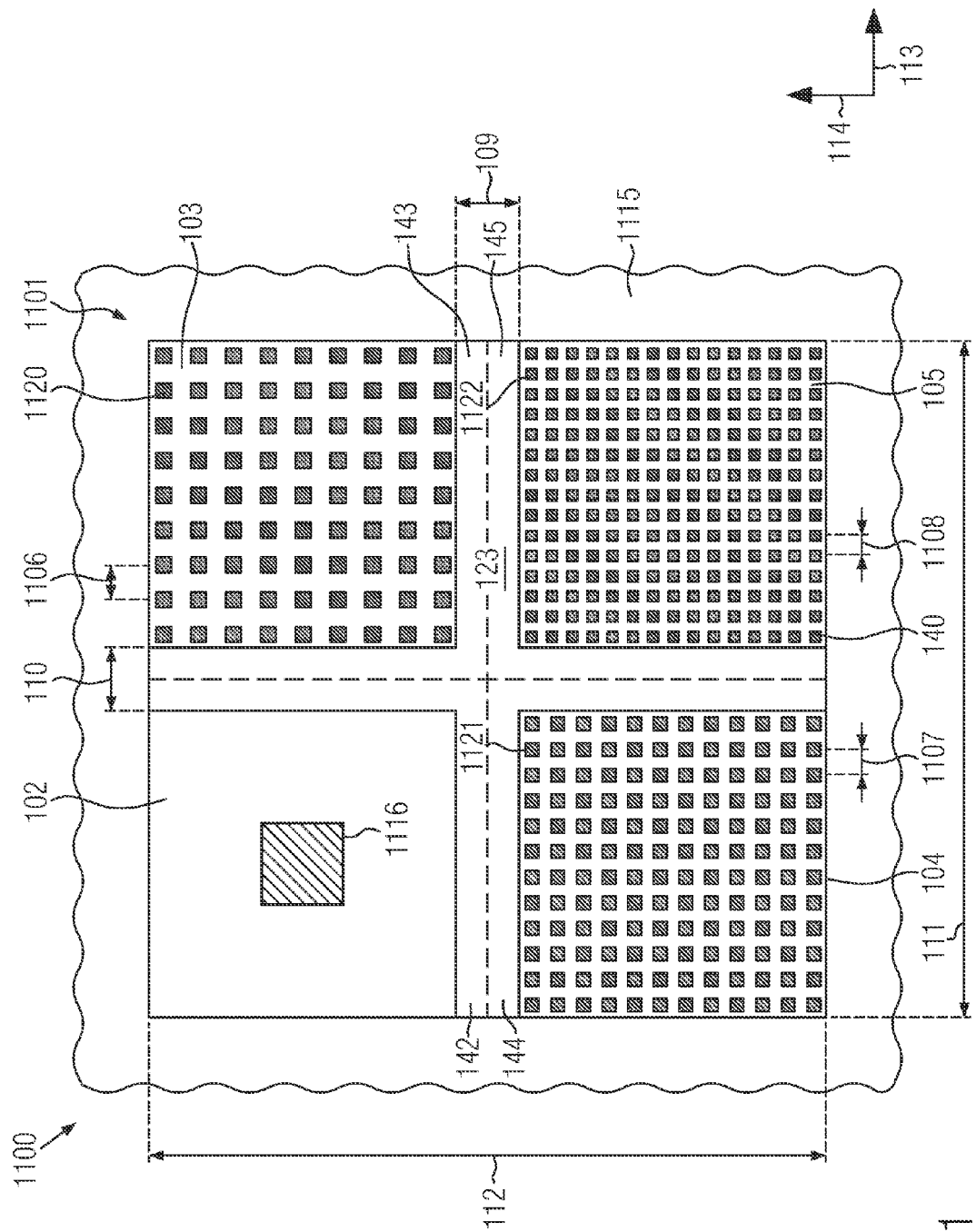
FIG. 11 shows a schematic view illustrating a pre-OPC layout of a portion of a reticle according to an embodiment.

FIG. 11 shows a schematic view illustrating a pre-OPC layout 1100 of a portion of a die area of a reticle 1115. For convenience, in FIGS. 1 and 11, like reference numerals have been used to denote like components. Unless explicitly stated otherwise, components denoted by like reference numerals may have corresponding features.

The pre-OPC layout 1100 includes a test cell 1101. The test cell 1101 includes test cell areas 102, 103, 104, 105 and a gap area 123 provided by test cell bond areas 142, 143, 144, 145 of the test cell areas 102, 103, 104, 105. The gap area 123 may have an extension 110 in a direction 113 (horizontal in the view of FIG. 11) and an extension 109 in a direction 114 (vertical in the view of FIG. 11), wherein the extensions 109, 110 may be approximately equal. The test cell 1101 may have extensions 111, 112 in the directions 113, 114, respectively, which may be approximately equal. In some embodiments, values of the extensions 109, 110, 111, 112 may correspond to those described above with reference to FIG. 1.

The test cell area 102 may include a registration test pattern 1116. In some embodiments, the registration test pattern 1116 may include a target feature having an approximately square shape, as shown in FIG. 11. In other embodiments, the registration test pattern 1116 may include a target feature having a cross-shape similar to that of the registration test pattern 116 described above with reference to FIG. 1.

Each of the test cell areas 103, 104, 105 may include a plurality of target features. In FIG. 11, reference numeral 1120 exemplarily denotes one of the target features in the test cell area 103, and reference numerals 1121 and 1122, respectively, denote exemplary target features in the test cell areas 104 and 105, respectively.

Each of the target features in the test cell areas 103, 104, 105 may have a shape adapted for the formation of contact vias, for example, an approximately square shape. The target features in the test cell area 103 may be arranged in a regular pattern, wherein a distance between adjacent ones of the target features in the test cell area 103 is approximately equal to a pitch 1106. The target features in the test cell area 104 may be arranged in a regular pattern wherein a distance between adjacent ones of the target features in the test cell area 104 is approximately equal to a pitch 1107, and the target features in the test cell area 105 may be arranged in a regular pattern wherein a distance between adjacent ones of the target features in the test cell area 105 is approximately equal to a pitch 1108.

The pitch 1106 may be greater than the pitch 1107, and the pitch 1107 may be greater than the pitch 1108. In some embodiments, the pitch 1108 may be determined on the basis of an anchor pitch of a photolithography process wherein the reticle 1115 is to be used. In particular, the pitch 1108 may be adapted such that photoresist features having a pitch approximately equal to the anchor pitch are formed on the wafer in a photolithography process wherein the reticle 1115 is used.

The pitch 1107 may be determined on the basis of a first problematic pitch of the photolithography process wherein the reticle 1115 is to be used. The pitch 1107 may be adapted such that photoresist features having a pitch that is near the first problematic pitch but different from the first problematic pitch are formed.

The pitch 1106 may be determined on the basis of a second problematic pitch of the photolithography process wherein the reticle 1115 is to be used. The pitch 1106 may be adapted such that photoresist features having a pitch that is near the second problematic pitch but different from the second problematic pitch are formed.

In some embodiments, the pitch of the photoresist features formed at portions of the wafer corresponding to the test cell area 104 and the test cell area 103, respectively, can differ from the first problematic pitch and the second problematic pitch, respectively, by about 5 nm to about 50 nm, for example, by about 10 nm. The pitches 1106, 1107, 1108 may be determined as described above with reference to FIGS. 2 and 3a-3d, wherein simulations of a photolithography process may be performed for regular patterns of shapes adapted for the formation of contact vias, such as approximately square shapes.

The pre-OPC layout 1100 may be used for forming a post-OPC layout of a portion of the reticle 1115. For forming the post-OPC layout, a rule-based OPC process may be performed for forming reticle features on the basis of the target feature in the test cell area 102 providing the registration test pattern 1116 and for forming reticle features on the basis of the target features in the test cell area 105. For forming reticle features on the basis of the target features in the test cell areas 103, 104, a model-based OPC process may be performed. Features of the rule-based OPC process and the model-based OPC process may correspond to those described above in the context of FIG. 4.

Then, the reticle 1115 may be formed on the basis of the post-OPC layout, and measurements of a reticle registration, measurements of a reticle CDU, measurements of a wafer CDU, process monitoring measurements and/or erosion measurements may be performed, wherein techniques as described above with reference to FIGS. 5a to 7d may be used.

Figure 12:
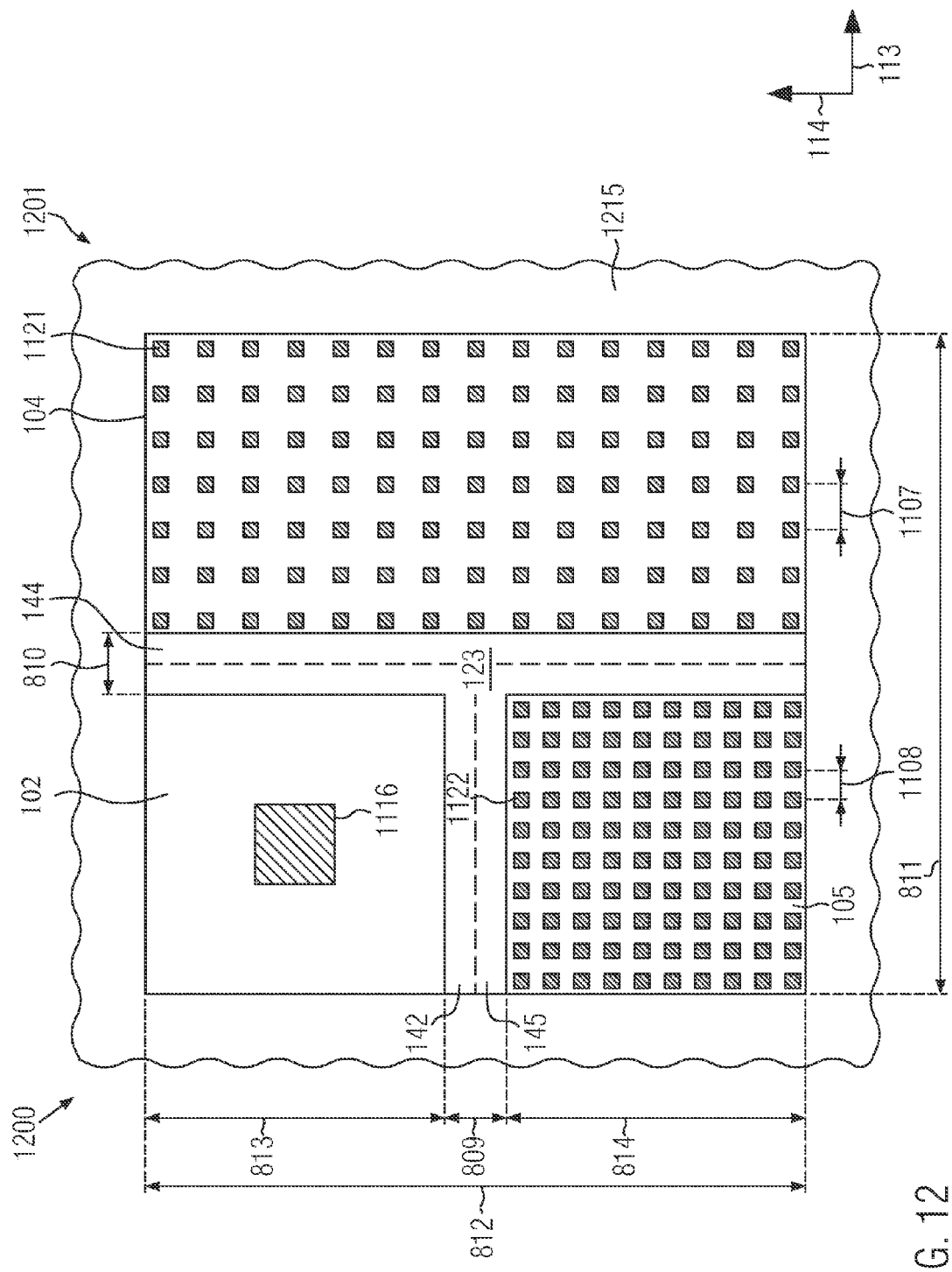
FIG. 12 shows a schematic view illustrating a pre-OPC layout of a portion of a reticle according to an embodiment.

FIG. 12 shows a schematic view illustrating a pre-OPC layout 1200 of a portion of a die area of a reticle 1215. For convenience, in FIGS. 1, 8, 11 and 12, like reference numerals have been used to denote like components. Unless explicitly stated otherwise, components denoted by like reference numerals may have corresponding features.

The pre-OPC layout 1200 includes a test cell 1201 including test cell areas 102, 104, 105 and a gap area 123 having extensions 809 and 810, respectively, in a direction 114 and in a direction 113, respectively. The gap area 123 may be provided by test cell bond areas 142, 144, 145 of the test cell areas 102, 104, 105. Extensions 811, 812 of the test cell 1201 in the directions 113 and 114, respectively, may be approximately equal. The test cell area 102 may have an extension 813 in the direction 114 and the test cell area 105 may have an extension 814 in the direction 114. In some embodiments, the extensions 813, 814 may be approximately equal. In other embodiments, the extension 813 may be smaller than the extension 814.

The test cell area 102 may include a target feature providing a registration test pattern 1116.

The test cell area 104 may include a regular pattern of target features having a shape adapted for the formation of contact vias and being arranged at a pitch 1107, an exemplary target feature in the test cell area 104 being denoted by reference numeral 1121.

The test cell area 105 may include a regular pattern of target features having a shape adapted for the formation of contact vias and being arranged at a pitch 1108, an exemplary target feature in the test cell area 105 being denoted by reference numeral 1122.

The pitch 1108 may be determined on the basis of an anchor pitch of a photolithography process wherein the reticle 1215 is to be used, and the pitch 1107 may be determined on the basis of a first problematic pitch of the photolithography process, in particular for providing a pitch near the first problematic pitch, as described above.

The pre-OPC layout 1200 may be used for forming a post-OPC layout of a portion of the reticle 1215. For forming the post-OPC layout, a rule-based OPC process may be performed for forming reticle features on the basis of the target features in the test cell areas 102, 105, and a model-based OPC process may be performed for forming reticle features on the basis of the target features in the test cell area 104.

Then, the reticle 1215 may be formed on the basis of the post-OPC layout, and measurements of a reticle registration, measurements of a reticle CDU, measurements of a wafer CDU, process monitoring measurements and/or erosion measurements may be performed, wherein techniques as described above with reference to FIGS. 5a to 7d may be used.

In further embodiments, the target features of the pre-OPC layout 1100 described above with respect to FIG. 11 and/or the target features of the pre-OPC layout 1200 described above with reference to FIG. 12 may be split into two or more subsets for providing pre-OPC layouts for two or more reticles that are used in multiple exposure processes wherein two or more exposures are performed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method, comprising:
providing a pre-optical proximity correction (OPC) layout of at least a portion of at least one reticle, said pre-OPC layout comprising a test cell comprising a first test cell area and a second test cell area, said first test cell area comprising a plurality of first target features having a first pitch, said second test cell area comprising a plurality of second target features having a second pitch;
forming a post-OPC layout of said at least a portion of said at least one reticle on the basis of said pre-OPC layout, the formation of said post-OPC layout comprising:
performing a rule-based OPC process wherein a plurality of first reticle features for said first test cell area are provided on the basis of said plurality of first target features; and
performing a model-based OPC process wherein a plurality of second reticle features for said second test cell area are provided on the basis of said plurality of second target features.

2. The method of claim 1, wherein said second pitch is greater than said first pitch.

3. The method of claim 2, further comprising:
identifying a first problematic pitch for a photolithography process wherein said at least one reticle is to be used;
wherein providing said pre-OPC layout comprises determining said second pitch on the basis of said first problematic pitch and arranging said plurality of second target features at said determined second pitch.

4. The method of claim 3, wherein providing said pre-OPC layout comprises determining said first pitch on the basis of an anchor pitch of said photolithography process and arranging said plurality of first target features at said determined first pitch.

5. The method of claim 4, wherein said test cell further comprises a third test cell area, said third test cell area comprising one or more third target features forming a registration test pattern and wherein performing said rule-based OPC process comprises providing one or more third reticle features on the basis of said one or more third target features.

6. The method of claim 5, wherein each of said plurality of first target features has a shape of an elongated line having a longitudinal direction substantially parallel to a first direction, wherein said plurality of first target features are arranged in a regular pattern, a distance between adjacent ones of said plurality of first target features in a second direction being substantially equal to said first pitch, said second direction being perpendicular to said first direction.

7. The method of claim 6, wherein each of said plurality of second target features has a shape of an elongated line having a longitudinal direction substantially parallel to said first direction, wherein said plurality of second target features are arranged in a regular pattern, a distance between adjacent ones of said plurality of second target features being substantially equal to said second pitch.

8. The method of claim 7, wherein said test cell further comprises a gap area provided between adjacent ones of said first test cell area, said second test cell area and said third test cell area.

9. The method of claim 8, further comprising forming one or more reticles on the basis of said post-OPC layout.

10. The method of claim 9, further comprising performing a reticle critical dimension uniformity (CDU) measurement at each of said one or more reticles wherein said first test cell area of said test cell is used.

11. The method of claim 9, further comprising:
providing a wafer;
forming a photoresist layer over said wafer;
exposing said photoresist layer, wherein said one or more reticles are used; and
after exposing said photoresist layer, performing a photoresist development process wherein a photoresist mask is formed from said exposed photoresist layer.

12. The method of claim 11, further comprising, after the formation of said photoresist mask, performing a wafer CDU measurement at said wafer, wherein at least one portion of said wafer corresponding to at least one of said first test cell area and said second test cell area is used.

13. The method of claim 11, further comprising:
performing one or more etch processes wherein said wafer is exposed to an etchant in the presence of said photoresist mask; and
after performing said one or more etch processes, removing said photoresist mask.

14. The method of claim 13, further comprising performing at least one of a wafer CDU measurement and an etch process monitoring measurement at said wafer after the removal of said photoresist mask, wherein at least one portion of said wafer corresponding to at least one of said first test cell area and said second test cell area are used.

15. The method of claim 13, further comprising:
after the removal of said photoresist mask, depositing a material layer over said wafer;
performing a chemical mechanical polishing process wherein a portion of said material layer is removed from said wafer; and
after said chemical mechanical polishing process, performing a chemical mechanical polishing process monitoring measurement at said wafer, wherein a portion of said wafer corresponding to at least a part of said test cell is used.

16. The method of claim 8, wherein each of said pre-OPC layout and said post-OPC layout comprises a layout of at least a portion of a first reticle and a layout of at least a portion of a second reticle,
wherein said pre-OPC layout of said at least a portion of said first reticle comprises a first subset of said plurality of first target features, a first subset of said plurality of second target features and a first subset of said plurality of third target features; and
wherein said pre-OPC layout of said at least a portion of said second reticle comprises a second subset of said plurality of first target features, a second subset of said plurality of second target features and a second subset of said plurality of third target features.

17. The method of claim 8, wherein said test cell further comprises a fourth test cell area, said fourth test cell area comprising a plurality of fourth target features having a third pitch, wherein said third pitch is greater than said first pitch and said second pitch and wherein performing said model-based OPC process comprises providing a plurality of fourth reticle features on the basis of said plurality of fourth target features.

18. The method of claim 17, further comprising:
identifying a second problematic pitch for said photolithography process wherein said at least one reticle is to be used;
wherein providing said pre-OPC layout comprises determining said third pitch on the basis of said second problematic pitch and arranging said plurality of fourth target features at said determined third pitch.

19. The method of claim 18, wherein each of said plurality of fourth target features has a shape of an elongated line having a longitudinal direction substantially parallel to said first direction, wherein said plurality of fourth target features are arranged in a regular pattern, a distance between adjacent ones of said plurality of fourth target features in said second direction being substantially equal to said third pitch.

20. The method of claim 19, wherein said test cell has a generally rectangular shape, wherein said first test cell area is provided in a first quadrant of said test cell, said second test cell area is provided in a second quadrant of said test cell, said third test cell area is provided in a third quadrant of said test cell and said fourth test cell area is provided in a fourth quadrant of said test cell.

21. The method of claim 8, wherein said test cell has a generally rectangular shape, wherein said first test cell area and said third test cell area are arranged adjacent each other along one of said first direction and said second direction and wherein said second test cell area is arranged adjacent said first test cell area along the other of said first direction and said second direction and adjacent said second test cell area along the other of said first direction and said second direction.

22. The method of claim 21, wherein an extension of said first test cell area in said one of said first direction and said second direction is greater than an extension of said third test cell area along said one of said first direction and said second direction.

23. The method of claim 22, wherein said first target features comprise one or more printing protection features having a greater width than other target features of said first target features.

24. The method of claim 1, wherein each of said plurality of first target features has a shape adapted for a formation of contact vias, wherein said plurality of first target features are arranged in a regular pattern, a distance between adjacent ones of said plurality of first target features being substantially equal to said first pitch, wherein each of said plurality of second target features has a shape adapted for a formation of contact vias, wherein said plurality of second target features are arranged in a regular pattern, a distance between adjacent ones of said plurality of second target features being substantially equal to said second pitch.

25. A reticle, comprising:
a die area, said die area comprising a test cell, said test cell comprising a first test cell area, a second test cell area and a third test cell area;
wherein said first test cell area comprises a plurality of first reticle features adapted for patterning a photoresist in a photolithography process so that a plurality of first photoresist features having a first pitch are formed;
wherein said second test cell area comprises a plurality of second reticle features adapted for patterning said photoresist in said photolithography process so that a plurality of second photoresist features having a second pitch are formed;
wherein said third test cell area comprises a plurality of third reticle features adapted for patterning said photoresist in said photolithography process so that one or more third photoresist features forming a registration test pattern are formed; and
wherein said second pitch is greater than said first pitch.

26. The reticle of claim 25, wherein said test cell has a generally rectangular shape, wherein said first test cell area and said third test cell area are arranged adjacent each other along a first direction and said second test cell area is arranged adjacent said first test cell area along a second direction and adjacent said third test cell area along said second direction, wherein said second direction is perpendicular to said first direction.

27. The reticle of claim 25, wherein:

said test cell further comprises a fourth test cell area comprising a plurality of fourth reticle features adapted for patterning said photoresist in said photolithography process so that a plurality of fourth photoresist features having a third pitch that is greater than said first pitch and said second pitch are formed; and said test cell has a generally rectangular shape, wherein said first test cell area is arranged in a first quadrant of said test cell, said second test cell area is arranged in a second quadrant of said test cell, said third test cell area is arranged in a third quadrant of said test cell and said fourth test cell area is arranged in a fourth quadrant of said test cell.

28. A system, comprising:

a plurality of reticles adapted for use in a multiple patterning photolithography process;

each of said plurality of reticles comprising a die area, said die area comprising a test cell, said test cell comprising a first test cell area, a second test cell area and a third test cell area;

wherein said first test cell area of said test cell of said plurality of reticles is adapted for patterning a photoresist in said multiple patterning photolithography process so that a plurality of first photoresist features having a first pitch are formed;

wherein said second test cell area of said test cell of said plurality of reticles is adapted for patterning said photoresist in said multiple patterning photolithography process so that a plurality of second photoresist features having a second pitch are formed;

wherein said second pitch is greater than said first pitch; and wherein said third test cell area of said test cell of said plurality of reticles is adapted for patterning said photoresist in said multiple patterning photolithography process so that one or more registration test patterns are formed.

\* \* \* \* \*